US011360167B2

(12) United States Patent
Barnes

(10) Patent No.: US 11,360,167 B2
(45) Date of Patent: Jun. 14, 2022

(54) SYSTEMS, SPHERICAL ROTORS, STATORS, AND METHODS OF USE

(71) Applicant: Washington University, St. Louis, MO (US)

(72) Inventor: Alexander Barnes, St. Louis, MO (US)

(73) Assignee: Washington University, St. Louis, MO (US)

( * ) Notice: Subject to any disclaimer, the term of this patent is extended or adjusted under 35 U.S.C. 154(b) by 0 days.

(21) Appl. No.: 16/768,801

(22) PCT Filed: Nov. 29, 2018

(86) PCT No.: PCT/US2018/062998
§ 371 (c)(1),
(2) Date: Jun. 1, 2020

(87) PCT Pub. No.: WO2019/108754
PCT Pub. Date: Jun. 6, 2019

(65) Prior Publication Data
US 2021/0181275 A1  Jun. 17, 2021

Related U.S. Application Data

(60) Provisional application No. 62/703,278, filed on Jul. 25, 2018, provisional application No. 62/672,840, filed on May 17, 2018, provisional application No. 62/593,546, filed on Dec. 1, 2017.

(51) Int. Cl.
*G01R 33/30* (2006.01)
*G01R 33/31* (2006.01)
*G01R 33/46* (2006.01)

(52) U.S. Cl.
CPC ........... *G01R 33/307* (2013.01); *G01R 33/31* (2013.01); *G01R 33/46* (2013.01)

(58) Field of Classification Search
CPC ....... G01R 33/307; G01R 33/31; G01R 33/46
See application file for complete search history.

(56) References Cited

U.S. PATENT DOCUMENTS

| | | | | |
|---|---|---|---|---|
| 3,681,683 A | * | 8/1972 | Huber | G01R 33/307 324/321 |
| 3,696,258 A | | 10/1972 | Anderson et al. | |
| 4,201,941 A | * | 5/1980 | Fyfe | G01R 33/307 324/321 |
| 4,275,350 A | * | 6/1981 | Hill | G01R 33/307 324/321 |
| 4,511,841 A | | 4/1985 | Bartuska et al. | |
| 4,775,836 A | | 10/1988 | Starewicz et al. | |
| 5,159,271 A | * | 10/1992 | Llor | G01R 33/30 324/318 |

(Continued)

OTHER PUBLICATIONS

Andreas, L. B. et al., Structure of fully protonated proteins by proton-detected magic-angle spinning NMR. Proc. Natl. Acad. Sci. U.S.A. 113, 9187-9192 (2016).

(Continued)

*Primary Examiner* — G. M. A Hyder
(74) *Attorney, Agent, or Firm* — Foley & Lardner LLP

(57) ABSTRACT

Among the various aspects of the present disclosure is the provision of systems and spherical rotors suitable for use in magic angle spinning (MAS) nuclear magnetic resonance (NMR) spectroscopy and methods of use thereof.

34 Claims, 20 Drawing Sheets

(56) References Cited

U.S. PATENT DOCUMENTS

| | | |
|---|---|---|
| 5,325,059 A | 6/1994 | Doty |
| 5,508,615 A | 4/1996 | Doty et al. |
| 7,196,521 B2 | 3/2007 | Doty |
| 2014/0097843 A1* | 4/2014 | Endo .................. G01R 33/307 324/321 |

OTHER PUBLICATIONS

Andrew, E. R. et al., Nuclear magnetic resonance spectra from a crystal rotated at high speed. Nature 182, 1659 (1958).
Baker, L. A. et al., Combined 1H-detected solid-state NMR spectroscopy and electron cryotomography to study membrane proteins across resolutions in native environments. Structure 26, 161-170.e3 (2018).
Barnes, A. B. et al., Cryogenic sample exchange NMR probe for magic angle spinning dynamic nuclear polarization. J. Magn. Reson. 198, 261-270 (2009).
Bertmer, M. et al., Solid-state photodimerization kinetics of α-trans-cinnamic acid to α-truxillic acid studied via solid-state NMR. J. Phys. Chem. B 110, 6270-6273 (2006).
Can, T. V. et al., Frequency-swept integrated solid effect. Angew. Chem. Int. Ed. 56, 6744 (2017).
Castellani, F. et al., Structure of a protein determined by solid-state magic-angle-spinning NMR spectroscopy. Nature 420, 98-102 (2002).
Caulkins, B. G. et al., NMR crystallography of a carbanionic intermediate in tryptophan synthase: Chemical structure, tautomerization, and reaction specificity. J. Am. Chem. Soc. 138, 15214-15226 (2016).
Chevelkov, V. et al., 1H detection in MAS solid-state NMR spectroscopy of biomacromolecules employing pulsed field gradients for residual solvent suppression. J. Am. Chem. Soc. 125, 7788-7789 (2003).
Chmelka, B. F. et al., Oxygen-17 NMR in solids by dynamic-angle spinning and double rotation. Nature 339, 42-43 (1989).
Eddy, M. T. et al., Magic angle spinning nuclear magnetic resonance characterization of voltage-dependent anion channel gating in two-dimensional lipid crystalline bilayers. Biochemistry 54, 994-1005 (2015).
Frye, J. S. et al., Setting the magic angle using a quadrupolar nuclide. J. Magn. Reson. 48, 125-131 (1982).
Hoff, D. E. M. et al., Frequency swept microwaves for hyperfine decoupling and time domain dynamic nuclear polarization. Solid State Nucl. Magn. Reson. 72, 79-89 (2015).
Hoop, C. L. et al., Huntingtin exon 1 fibrils feature an interdigitated β-hairpin-based polyglutamine core. Proc. Natl. Acad. Sci. U.S.A. 113, 1546-1551 (2016).
International Search Report and Written Opinion dated Feb. 6, 2019 in corresponding International Application No. PCT/US18/62998 filed Nov. 29, 2018, 14 pages.
Kaplan, M. et al., EGFR Dynamics Change during Activation in Native Membranes as Revealed by NMR. Cell 167, 1241-1251.e11 (2016).
Kaplan, M. et al., Probing a cell-embedded megadalton protein complex by DNP-supported solid-state NMR. Nat. Methods 12, 649-652 (2015).
Kolbert, A. C. et al., Measurement of internuclear distances by switched angle spinning. J. Phys. Chem. 98, 7936-7938 (1994).
Lesage, A. et al., Surface enhanced NMR spectroscopy by dynamic nuclear polarization. J. Am. Chem. Soc. 132, 15459-15461 (2010).
Litvak, I. M. et al., Pneumatic switched angle spinning NMR probe with capacitively coupled double saddle coil. J. Magn. Reson. 206, 183-189 (2010).
Lowe, I. J., Free induction decays of rotating solids. Phys. Rev. Lett. 2, 285-287 (1959).
McCrate, O. A. et al., Sum of the parts: Composition and architecture of the bacterial extracellular matrix. J. Mol. Biol. 425, 4286-4294 (2013).
McDermott, A., Structure and dynamics of membrane proteins by magic angle spinning solid-state NMR. Annu. Rev. Biophys. 38, 385-403 (2009).
Mihaliuk, E. et al., Using heat to control the sample spinning speed in MAS NMR. J. Magn. Reson. 212, 249-253 (2011).
Ni, Q. Z. et al., Primary transfer step in the light-driven ion pump bacteriorhodopsin: An irreversible U-turn revealed by dynamic nuclear polarization-enhanced magic angle spinning NMR. J. Am. Chem. Soc. 140, 4085-4091 (2018).
Petkova, A. T. et al., Self-propagating, molecular-level polymorphism in Alzheimer's b-amyloid fibrils. Science 307, 262-265 (2005).
Renault, M. et al., Solid-state NMR spectroscopy on cellular preparations enhanced by dynamic nuclear polarization. Angew. Chem. Int. Ed. Engl. 51, 2998-3001 (2012).
Retel, J. S. et al., Structure of outer membrane protein G in lipid bilayers. Nat. Commun. 8, 2073 (2017).
Rossini, A. J. et al., Dynamic nuclear polarization enhanced solid-state NMR spectroscopy of functionalized metal-organic frameworks. Angew. Chem. 51, 123-127 (2012).
Saliba, E. P. et al., Electron decoupling with dynamic nuclear polarization in rotating solids. J. Am. Chem. Soc. 139, 6310-6313 (2017).
Samoson, A. et al., High resolution solid-state N.M.R. Mol. Phys. 65(4), 1013-1018 (1988).
Schuck, M. et al., Ultrafast rotation of magnetically levitated macroscopic steel spheres. Sci. Adv. 4, e1701519 (2018).
Siemer, A. B. et al., High-resolution solid-state NMR spectroscopy of the prion protein HET-s in its amyloid conformation. Angew. Chem. Int. Ed. Engl. 44, 2441-2444 (2005).
Stong, C.L., How to Inake electrets, devices that hold electrostatic charge, Scientific American, vol. 219, No. 1 (Jul. 1968), pp. 122-132.
Terao, T. et al., Switching-angle sample-spinning NMR spectroscopy for obtaining powder-pattern-resolved 2D spectra: Measurements of 13C chemical-shift anisotropies in powdered 3,4-dimethoxybenzaldehyde. Chem. Phys. Lett. 107, 145-148 (1984).
Theint, T. et al., Species-dependent structural polymorphism of Y145Stop prion protein amyloid revealed by solid-state NMR spectroscopy. Nat. Commun. 8, 753 (2017).
Thongsomboon, W. et al., Phosphoethanolamine cellulose: A naturally produced chemically modified cellulose. Science 359, 334-338 (2018).
Tuttle, M. D. et al., Solid-state NMR structure of a pathogenic fibril of full-length human α-synuclein. Nat. Struct. Mol. Biol. 23, 1-9 (2016).
Wang, Z. et al., Quantitative atomic-scale structure characterization of ordered mesoporous carbon materials by solid state NMR. Carbon 131, 102-110 (2018).
Wickramasinghe, N. P. et al., Sensitivity enhancement, assignment, and distance measurement in 13C solid-state NMR spectroscopy for paramagnetic systems under fast magic angle spinning. J. Magn. Reson. 181, 233-243 (2006).
Xue, K. et al., Magic angle spinning frequencies beyond 300 kHz are necessary to yield maximum sensitivity in selectively methyl protonated protein samples in solid state NMR. J. Phys. Chem. C 122, 16437-16442 (2018).
Yang, H. et al., REDOR NMR reveals multiple conformers for a protein kinase C ligand in a membrane environment. ACS Cent. Sci. 4, 89-96 (2018).
Zech, S. G. et al., Protein structure determination by high-resolution solid-state NMR spectroscopy: Application to microcrystalline ubiquitin. J. Am. Chem. Soc. 127, 8618-8626 (2005).
Zhou, D. H. et al., Sensitivity and resolution in proton solid-state NMR at intermediate deuteration levels: Quantitative linewidth characterization and applications to correlation spectroscopy. J. Magn. Reson. 178, 297-307 (2006).
Chen, Pinhui et al., "Magic angle spinning spheres," Sciences Advances, 4(9):1540, Sep. 21, 2018. (8 pages).
Extended European Search Report dated Jul. 20, 2021, for EP 18884180.3. (8 pages).
International Preliminary Report of Patentability, Ch. I, for PCT/US2018/062998 dated Jun. 11, 2020 (8 pages).

(56) References Cited

OTHER PUBLICATIONS

International Search Report and Written Opinion for PCT/US18/62998 dated Feb. 6, 2019 (10 pages).
Strong, C.L., "How to Make an Electret: the Device That Permanently Maintains an Electric Charge", Scientific America, Nov. 1960, retrieved Dec. 5, 2021 from URL: http://www.tuks.nl/pdf/Reference_Material/Electrets/Strong%20-%20How%20to%20make%20an%20Electret%20-%201960.pdf (10 pages).

* cited by examiner

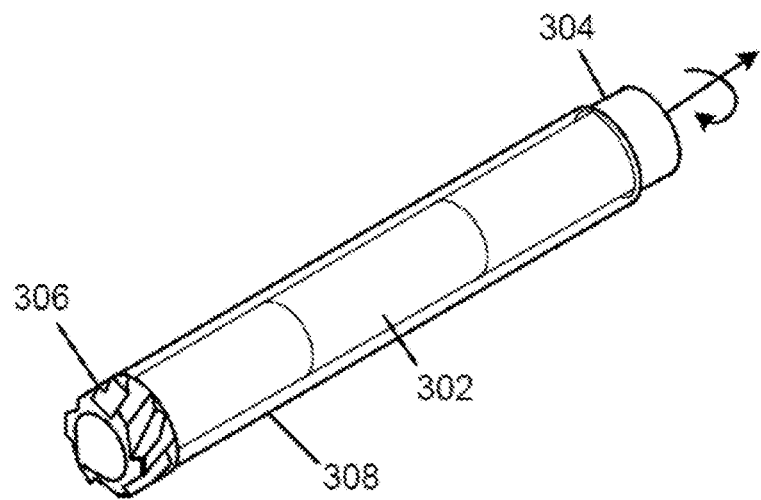
FIG. 3A(i)
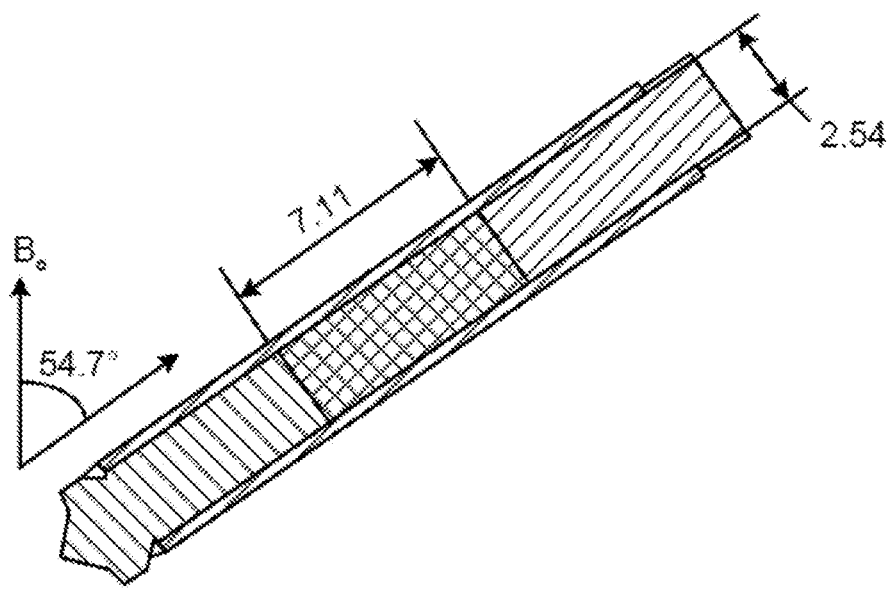
FIG. 3A(ii)

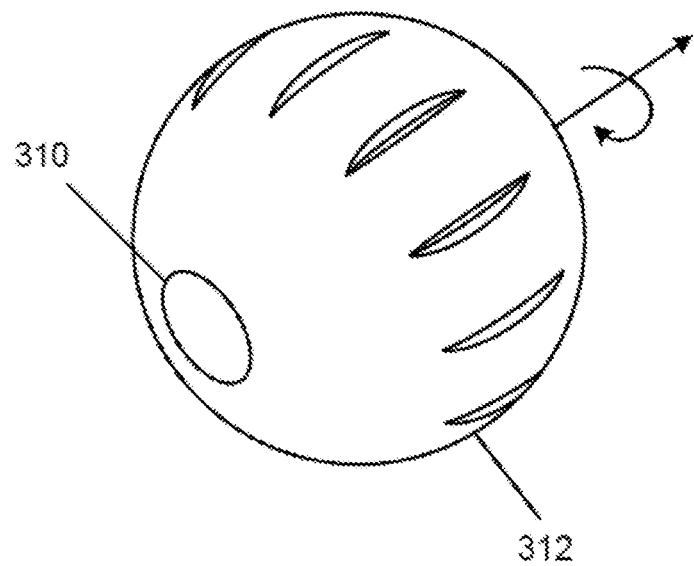
FIG. 3B(i)
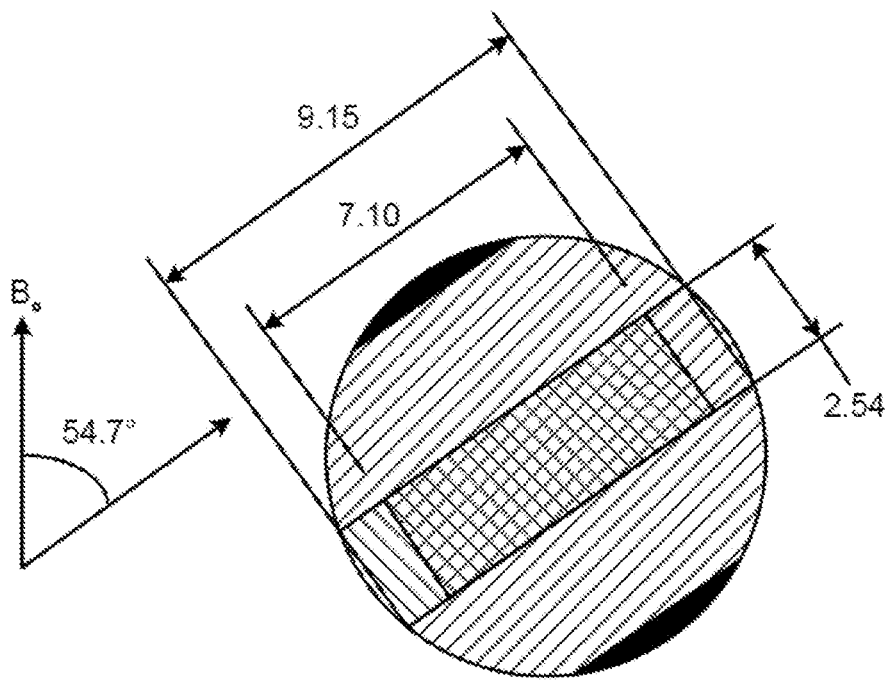
FIG. 3B(ii)

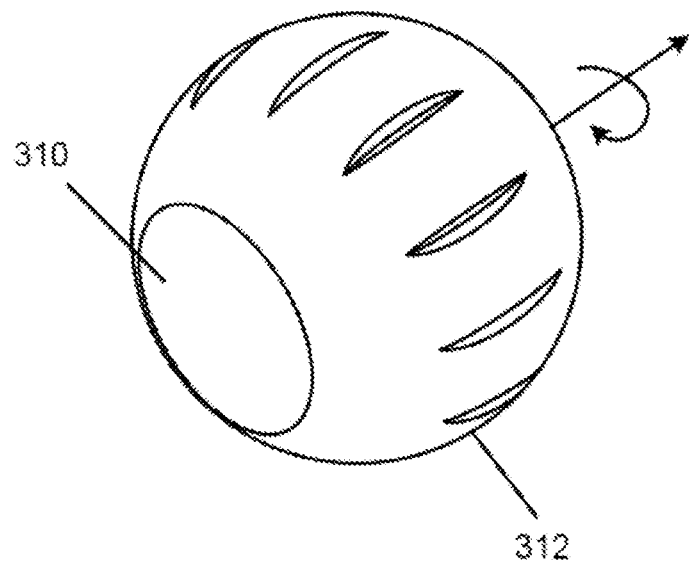
FIG. 3C(i)
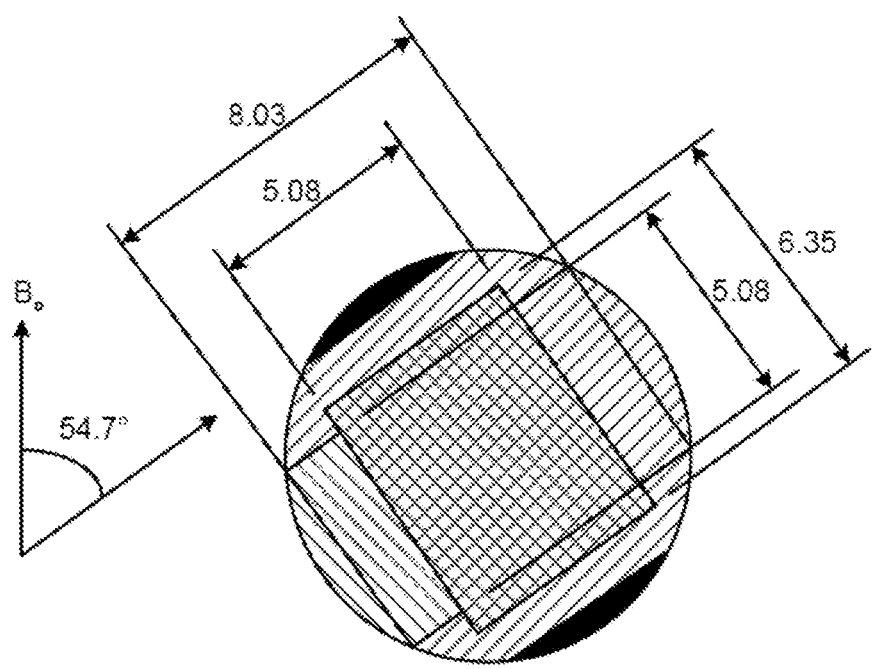
FIG. 3C(ii)

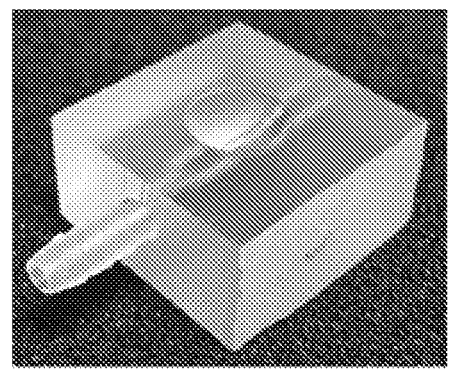
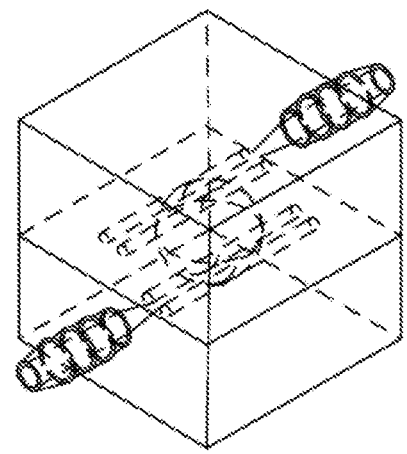
FIG. 4A(i)
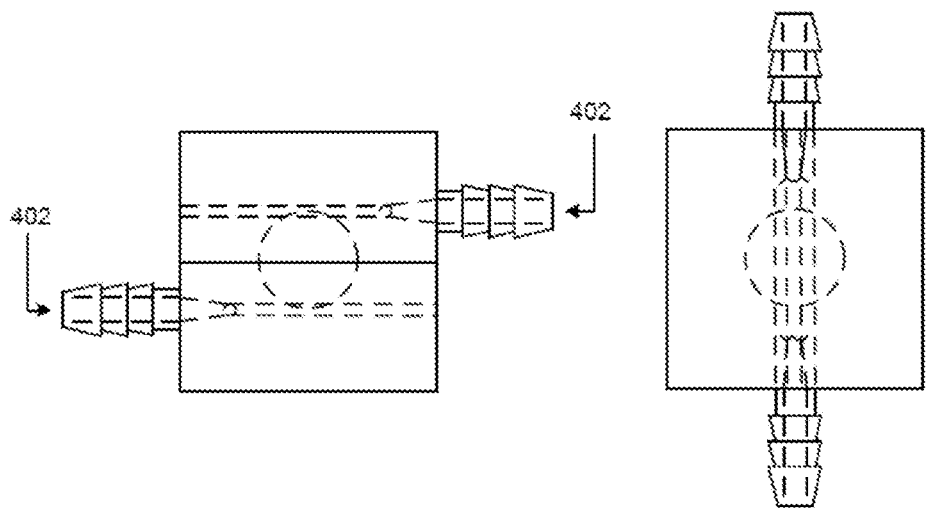
FIG. 4A(ii)  FIG. 4A(iii)

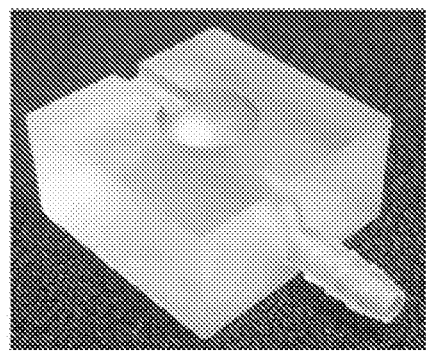
FIG. 4B(i)
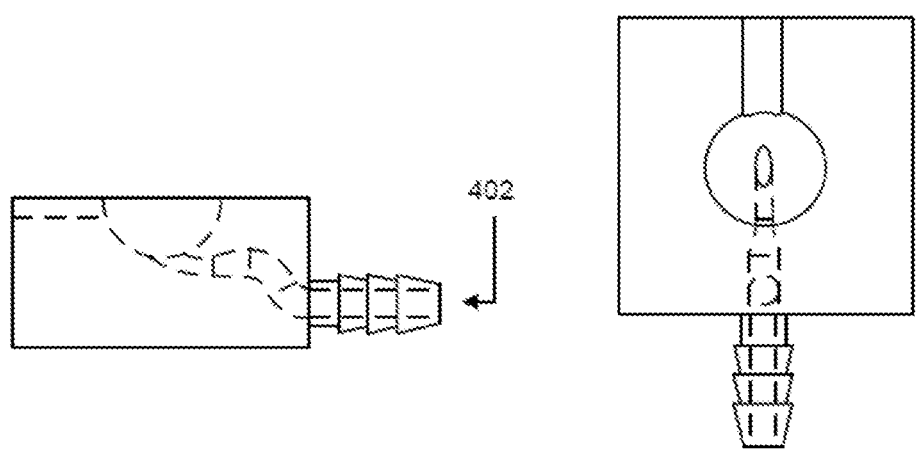
FIG. 4B(ii)  FIG. 4B(iii)

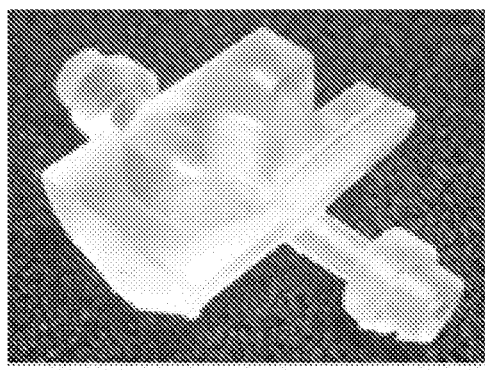
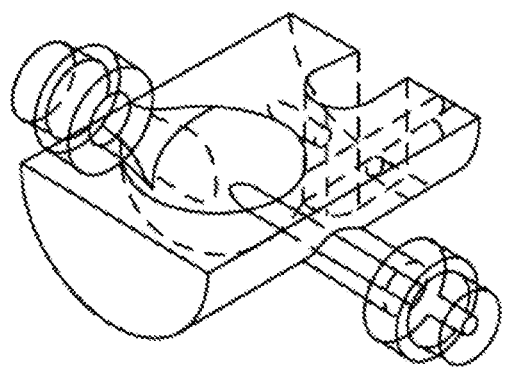
FIG. 4C(i)
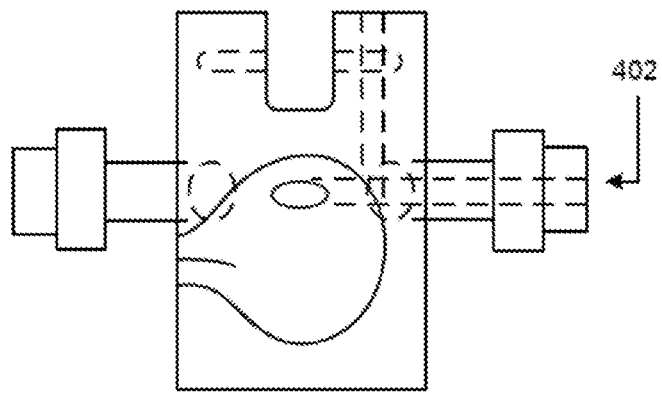
FIG. 4C(ii)  FIG. 4C(iii)

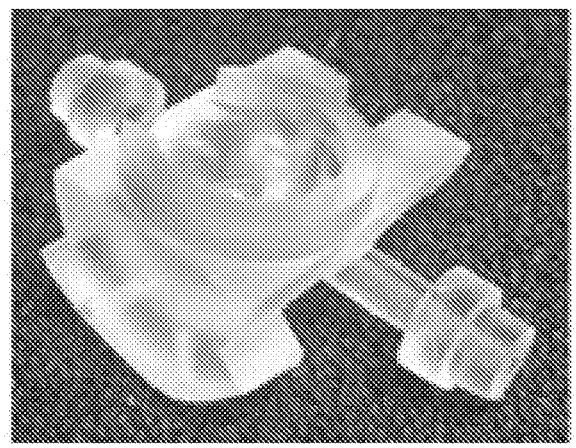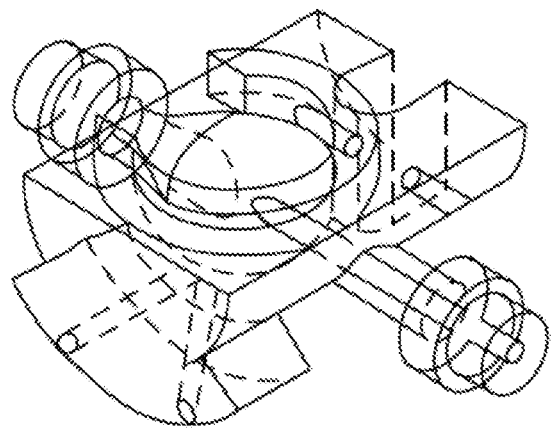
FIG. 4D(i)
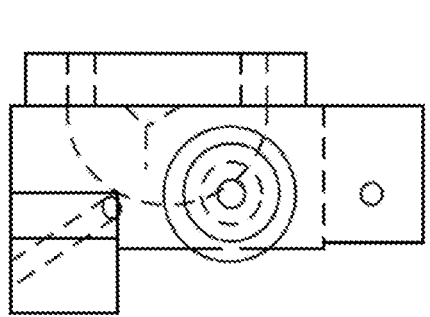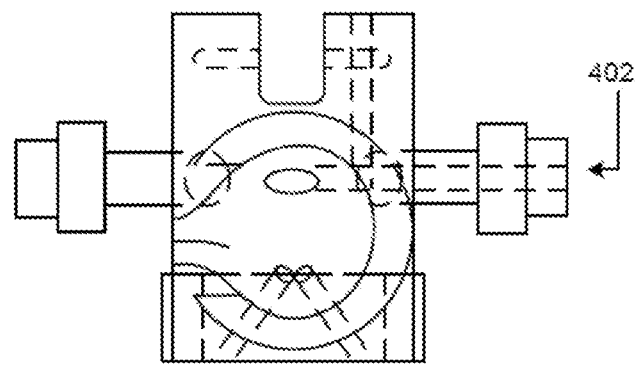
FIG. 4D(ii)          FIG. 4D(iii)

SYSTEMS, SPHERICAL ROTORS, STATORS, AND METHODS OF USE

CROSS-REFERENCE TO RELATED APPLICATIONS

This application claims the benefit of priority to PCT International Application No. PCT/US18/62998 filed on 29 Nov. 2018, which claims the benefit of U.S. Provisional Application Ser. No. 62/703,278 filed on 25 Jul. 2018; U.S. Provisional Application Ser. No. 62/672,840 filed on 17 May 2018; and U.S. Provisional Application Ser. No. 62/593,546 filed on 1 Dec. 2017, which are incorporated herein by reference in their entireties.

STATEMENT REGARDING FEDERALLY SPONSORED RESEARCH OR DEVELOPMENT

This invention was made with government support under grant number GM119131 awarded by National Institutes of Health. The government has certain rights in the invention.

MATERIAL INCORPORATED-BY-REFERENCE

Not applicable.

FIELD OF THE INVENTION

The present disclosure generally relates to devices and methods for use in magnetic resonance spectroscopy.

SUMMARY OF THE INVENTION

Among the various aspects of the present disclosure is the provision of a rotor suitable for use in NMR spectroscopy and methods of use thereof.

An aspect of the present disclosure provides for a spherical rotor comprising a spherical rotor axis; a plurality of notches, equatorially spaced on the surface of the spherical rotor, wherein the equatorially spaced notches are equatorially spaced around the spherical rotor axis; or a sample chamber comprising a sample chamber axis. As an example, the sample chamber axis can be parallel to the spherical rotor axis.

Another aspect of the present disclosure provides for a system for use in nuclear magnetic resonance (NMR) spectroscopy. As an example, the system comprises a spherical rotor, wherein the spherical rotor comprises a spherical rotor axis and a plurality of notches, equatorially spaced on the surface of the spherical rotor, wherein the equatorially spaced notches are equatorially spaced around the spherical rotor axis; a sample chamber comprising a sample chamber axis, wherein the sample chamber axis is parallel to the spherical rotor axis; and a stator suitable for the incorporation and spinning of the spherical rotor, wherein the stator comprises at least one gas inlet and at least one exhaust gas outlet.

As another example, the spherical rotor comprises one or more sample chamber caps; the stator comprises one or more gas inlets; the stator comprises one or more exhaust gas outlets; or the stator comprises blind holes for incorporation of a fiber optic cable.

Yet another aspect of the present disclosure provides for a method of obtaining a nuclear magnetic resonance (NMR) signal. For example, the method comprises providing a sample; inserting the sample into a spherical rotor comprising equatorially spaced notches; placing the spherical rotor onto or into a stator, wherein the stator is inside an NMR probe; spinning the spherical rotor; and obtaining an NMR signal from the sample.

As another example, upon application of a fluid; a time-dependent electro, magnetic, or electromagnetic field; or light (e.g., circularly polarized light), the spherical rotor is a turbine.

As another example, the spherical rotor is between about 1 micron and 20 microns, about 20 microns or greater in size or between about 20 microns and 10 mm.

As another example, the spherical rotor or stator are 3D printed rotors or stators.

As another example, the system or method comprises an RF coil, wherein the system is suitable for incorporation into a liquid state NMR probe or a solid state NMR probe.

As another example, the spherical rotor comprises a sample.

As another example, the spherical rotor comprises a plurality of notches, at least one notch, or between one and 20 notches, wherein the notches provide torque to the spherical rotor when a fluid supply is applied to the spherical rotor.

As another example, the stator comprises a gas inlet, wherein the gas inlet provides a fluid supply to the spherical rotor.

As another example, the fluid supply provides bearing and turbine.

As another example, the system or method further comprises a fluid line for cooling of the fluid and spherical rotor comprising a sample to a temperature of less than about 4.2 K, resulting in a superfluid zero viscosity phase of helium.

As another example, the system or method of any one of the preceding claims, further comprising spinning the spherical rotor at about 54.7356° (the magic angle) with respect to a magnetic field.

As another example, the system or method comprises placing the spherical rotor into a magnetic field.

As another example, the system or method comprises switched angle magic angle spinning and a spinning axis, wherein the spinning axis is changed during an NMR experiment.

As another example, the system or method comprises spinning the spherical rotor comprising a sample; removing the spherical rotor from the magnetic field; returning a spherical rotor to the magnetic field; or detecting a nuclear magnetic resonance signal from the sample.

As another example, the system or method comprises a sample exchange system using the spherical rotor, wherein the sample exchange system comprises a sample exchange tube and a vacuum line or air line to eject the sample.

As another example, the system or method comprises fast mechanical exchange of the sphere into another magnet for signal detection or for storage of enhanced spin magnetization.

As another example, the system or method comprises placing the spherical rotor into a probe for NMR detection.

As another example, the spherical rotor comprises the sample or holds the sample.

As another example, the spherical rotor rotates at a frequency from about 0 kHz to about 130 kHz.

As another example, the spherical rotor is 3D printed or comprises zirconia.

As another example, the system or method comprises the gas is introduced under the sphere at 35.3° off of the magnetic field, $B_0$, suspends the sphere and aligns its spinning axis with the magic angle (54.7° with respect to the magnetic field, $B_0$).

As another example, the probe is a solid state NMR probe, a liquid state NMR probe, or a cryogenic MAS-DNP NMR probe.

As another example, the systems or method comprises a transmit-receive RF coil, wherein the RF coil is a four-turn split solenoid wrapped around the stator or the spherical rotor.

As another example, spinning of the spherical rotor can comprise polarizing the spherical rotor, allowing for spinning propulsion.

As another example, the spherical rotor comprises a composition having an intrinsic dipole moment (e.g., an electret, a ceramic).

As another example, the methods or system can comprise "phase locking" of the spinning system, allowing for enhanced spinning stability compared to a non-phase locked system.

As another example, the methods or system can comprise a cooling "bath" capable of reaching cryogenic temperatures between about 1.2 K and about 200 K and optionally a vacuum to achieve cryogenic temperatures below 2.23 K.

As another example, the methods or system can comprise creating a static electric dipole by applying a static electric field to a sample comprising mobile ions; and freezing the sample, "trapping" the separated positive and negative charges.

Other objects and features will be in part apparent and in part pointed out hereinafter.

DESCRIPTION OF THE DRAWINGS

Those of skill in the art will understand that the drawings, described below, are for illustrative purposes only. The drawings are not intended to limit the scope of the present teachings in any way.

FIG. 3A is an illustration of a cylindrical rotor (3.2 mm) with 36-µl sample volume. Spherical rotors (9.5 mm) include equatorial turbine grooves (or notches) cut into the surface to generate angular momentum.

FIG. 3B-FIG. 3C are illustrations of two machined sample chambers: (B) 36 µl and (C) 161 µl sample volume. All linear dimensions are in millimeters.

FIG. 4A-FIG. 4D are drawings and images of a selection of the four 3D printed stators for spherical rotors. (A) Enclosed design with multiple gas streams for spinning. (B) Open-face design with a single gas stream and a pathway to guide exhaust gas outlet. (C) Design complete with single gas stream, exhaust pathway, and pivots for adjustment of the angle (e.g., the magic angle). (D) In comparison to (C), a vertical extrusion of 2 mm were added above the cup of the stator, and blind holes were added to accept fiber optics for spinning frequency detection. (i) Shows perspective view, (ii) shows side view, and (iii) shows top view.

DETAILED DESCRIPTION OF THE INVENTION

Figure 1A:
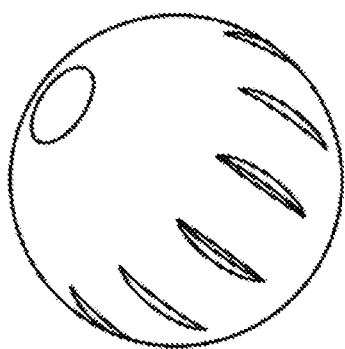
FIG. 1A-FIG. 1D are a series of images showing the design of an embodiment of the spherical rotor (spherical spinner). Scale 1:20.
Figure 1B:
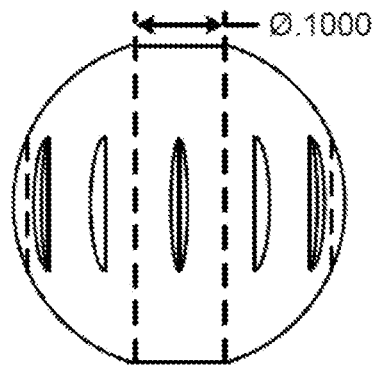
Figure 1C:
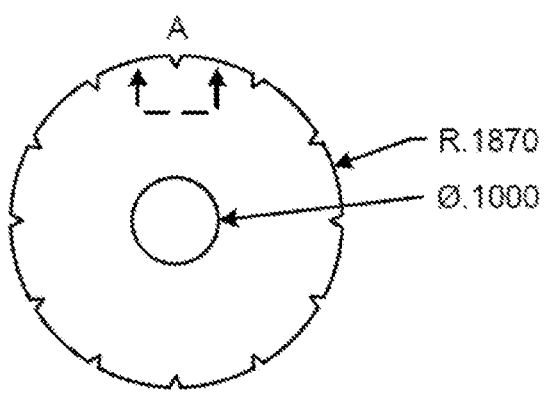
Figure 1D:
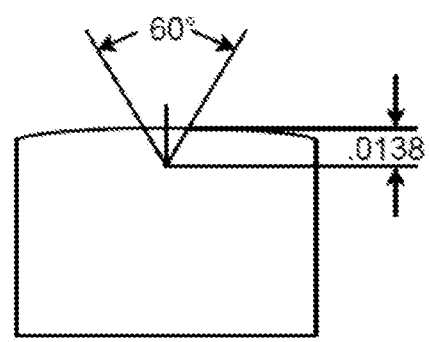

The present disclosure is based, at least in part, on the discovery that spinning spheres (a spinning spherical rotor)

show superior performance in magic angle spinning (MAS) experiments than the conventional spinning cylinders. A spherical rotor can be a spherical device capable of holding a sample, a spherical rotor comprising a sample, or a spherical sample holder for magic angle spinning (MAS) nuclear magnetic resonance (NMR) spectroscopy. The spherical rotors have improved properties (increased sensitivity) compared to the currently used cylinder-shaped sample holders.

As shown herein, successful spinning of spherical rotors with a large radius (e.g., 9.5 mm, 0.1875") has been demonstrated. Even given a relatively large diameter, the spherical rotors were able to spin easily at faster than about 10,000 to about 14,000 rotations per second (or at least about 10 kHz to about 14 kHz). This demonstration can be further optimized in terms of engineering and fabrication practices and to reach much higher spinning frequencies.

Magic Angle Spinning (MAS)/Variable Angle Spinning (VAS)

Magic angle spinning (MAS) refers to spinning the samples at an angle of 54.7° with respect to the magnetic field. The spinning averages out anisotropic interactions in the NMR Hamiltonian with a $(3 \cos^2\theta - 1)$ dependence, resulting in narrow NMR lines and well-resolved spectra.

Magic angle spinning (MAS) nuclear magnetic resonance (NMR) experiments partially average anisotropic spin interactions in the magnetic resonance Hamiltonian through mechanical rotation of samples about the magic angle (54.7° with respect to the static magnetic field, $B_0$). The spatial averaging extends spin relaxation times and improves the resolution of solid-state NMR spectroscopy (1, 2). Single resonances can often be assigned to chemically distinct nuclear spins to yield site-specific signatures encoding structural information and molecular dynamics (3-7). MAS NMR is, therefore, a powerful technique to characterize diverse molecular architectures including membrane proteins (8-15), amyloid fibrils (16-19), bacterial biofilms (20, 21), and materials and surfaces (22-25).

Mechanical sample rotation must be comparable to, or greater than, the frequency of the internal anisotropic spin interaction to produce significant averaging. Spinning frequencies less than 3 kHz averaged chemical shift anisotropy and weak dipole couplings at the advent of MAS. Currently available spinning frequencies of >150 kHz are sufficiently high to attenuate proton homonuclear couplings and yield spectra of solids with resolution approaching that observed in solution-state NMR (26-29). Over the past 60 years of MAS, samples have typically been packed into hollow cylindrical sample containers (rotors), with turbine inserts to supply drive propulsion (FIG. 3A).

Spinning cylinders around their short axes, as in current MAS experiments, is inherently unstable and limits the maximum spinning frequency in MAS. Objects in nature with very high angular momentum are not cylinders but spheres or ellipsoids (i.e., pulsars). Here, the present disclosure describes a novel design and technology of a spherical rotor to spin samples housed in spheres at an angle (e.g., the magic angle). Described herein are spherical rotors for use in nuclear magnetic resonance (NMR) spectroscopy.

There are roughly 200 academic labs and 100 industrial labs that perform magic angle spinning NMR (MAS NMR) experiments. Virtually every single one of these labs can adapt the disclosed technology.

NMR spectroscopy can elucidate atomic level structure and motion of chemical architectures ranging from the surface of materials to biomolecules within intact cells. There is already extensive use of NMR in the design of pharmaceutics, with even more promise of employing NMR for drug design in the future. Yet, NMR is plagued by poor sensitivity—solid state NMR signal averaging can last from minutes to months. In order to increase NMR sensitivity by more than factors of 50,000, disclosed herein is a novel technology and new spin physics methodology. In order to increase sensitivity, disclosed herein, is a new rotor that mechanically spins the sample (e.g., sample can comprise a drug, protein, or cells) at the "magic angle" within NMR magnets. Also shown herein are methods to cool the sample as cold as possible.

For the last 60 years, MAS-NMR samples have typically been packed in hollow, cylindrical sample containers with turbine inserts to supply drive propulsion. Scaling cylindrical rotors to micron sizes to access spinning frequencies >150 kHz is difficult. Cylinders are also difficult to insert and eject from stators within magnet bores. Furthermore, cryogenic MAS of cylinders requires substantial quantities of cryogens, especially in dynamic nuclear polarization (DNP) experiments. Furthermore, cylindrical rotors are surrounded by solenoids that also complicate microwave coupling strategies aiming to maximize electron spin Rabi frequencies for electron decoupling and pulsed DNP.

Variable angle spinning (VAS) is a technique used in solid-state NMR experiments to achieve the controlled reintroduction of dipolar couplings by varying the angle at which the sample is spun relative to the applied magnetic field. VAS is used for many applications including the regulation of liquid crystal orientation with respect to the magnetic field. The spherical rotors can also be used in switched angle spinning (SAS) (38-40) and double angle rotation (DOR). For example, introducing a variable angle adjuster or a second gas inlet into the stator could establish spinning off of the magic angle.

Stators, Probes, and Rotors

The components and system as described herein includes stators, probes, or rotors suitable for use in variable angle spinning (VAS) or magic angle spinning (MAS) nuclear magnetic resonance spectroscopy (NMR) and also VAS or MAS electron paramagnetic resonance (EPR) spectroscopy.

Provided herein are embodiments including a spherical rotor, the integration of a sample exchange system using the spherical rotors; integration of magic angle, variable angle, or switched angle magic angle spinning, in which the spinning axis can be changed during the NMR experiment; continual spinning while moving the sphere out of the magnetic field, and back for a magnetic resonance experiment; fast mechanical exchange of the sphere into another magnet for signal detection, or for storage of enhanced spin magnetization; integration of a single gas stream or fluid line to provide bearing and turbine; or integration of a single fluid line for cooling of the fluid (e.g., gas) and sample to <4.2 K, leading to a superfluid zero viscosity phase of helium.

Figure 2A:
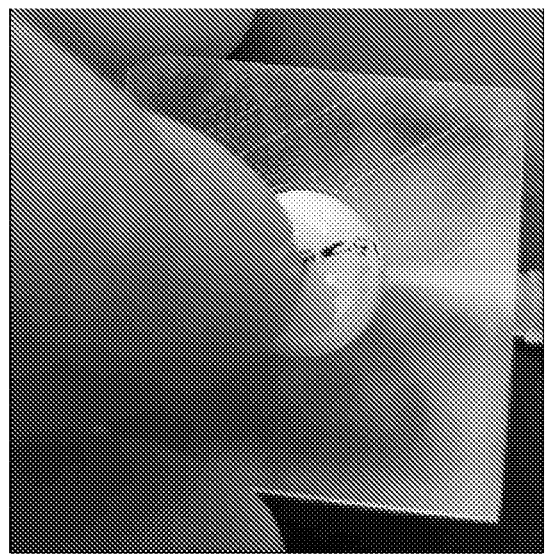
FIG. 2 is a series of images showing screen shots of a video showing the spherical sample holder (or spherical rotor) spinning at 0 Hz (A) and at approximately 6 kHz (max speed 14.5 kHz) (B). Air is blown through the tube to spin the sphere. Stability noted by black stripe down the center of the sphere (B).
Figure 2B:
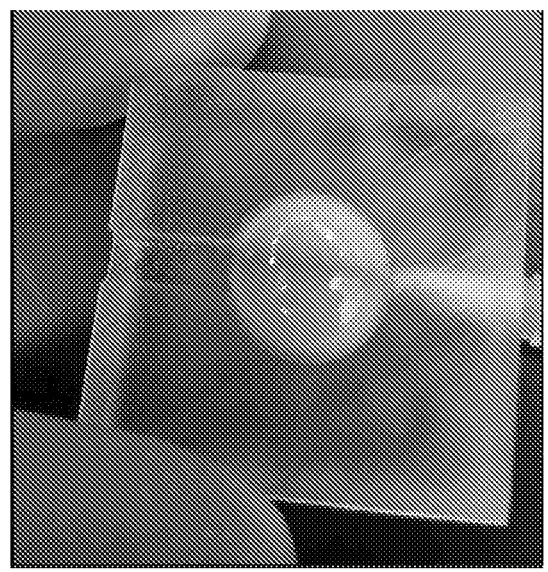

As an example, FIG. 1A-FIG. 1D are a series of images showing the design of an embodiment of the spherical rotor. As another example, FIG. 2 demonstrates a spherical rotor comprising a sample holder spinning at approximately 6 kHz (max measured speed 14.5 kHz). Air is blown through the air line to spin the sphere. Stability is noted by a black stripe down the center of the sphere (see e.g., FIG. 2B). The sphere shown in FIG. 2 is a 3D printed spherical rotor (sphere spinner) comprising zirconia. As another example, FIG. 3 and FIG. 8 describe rotors comprising a sample volume, a sample (or sample chamber) 302, a top cap 304, a turbine insert 306, a cylindrical rotor 308, a cap 310, and a spherical rotor 312, 802. As another example, FIG. 4, FIG.

Figure 9A:
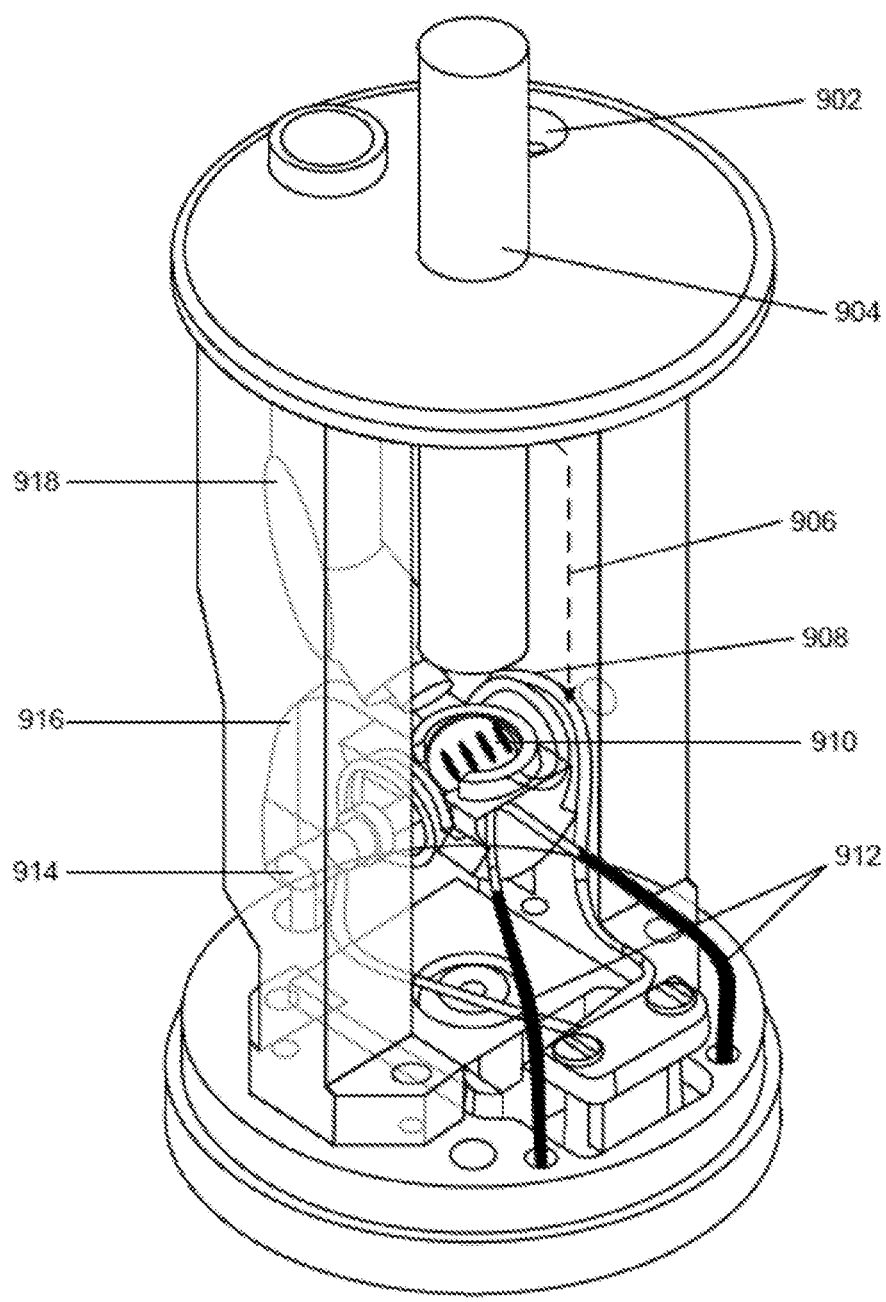
FIG. 9A-FIG. 9C is a series of drawings showing the implementation of the rotating spheres (spherical rotors) into a transmission line probe previously used in cryogenic MAS-DNP. (A) The pivots of the 3D printed stator serve as the gas inlet and as the pivot point for the magic angle adjustment. The complete NMR probe head includes fiber optics for spinning frequency detection, magic angle adjustment via a threaded adjustment assembly, waveguide to transmit microwaves to the sample for DNP, tube for sample exchange, and a 3D printed post for connection of the stator to the gas supply. An isometric view (B) and a section view (C) show the path for the introduction of microwaves to the sample for DNP in a section view. RF, radio frequency.
Figure 9B:
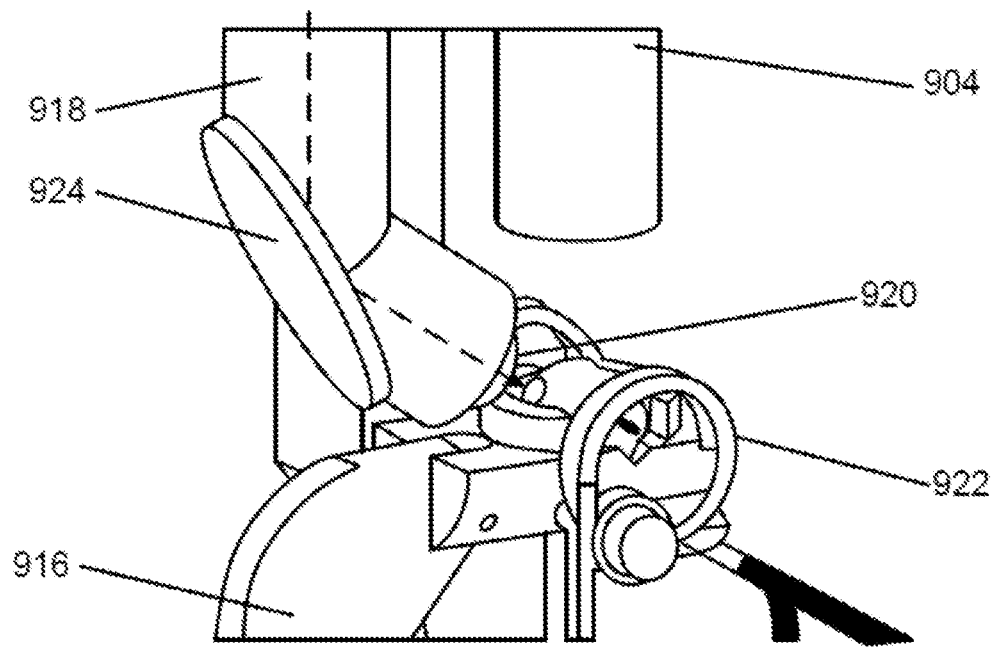
Figure 9C:
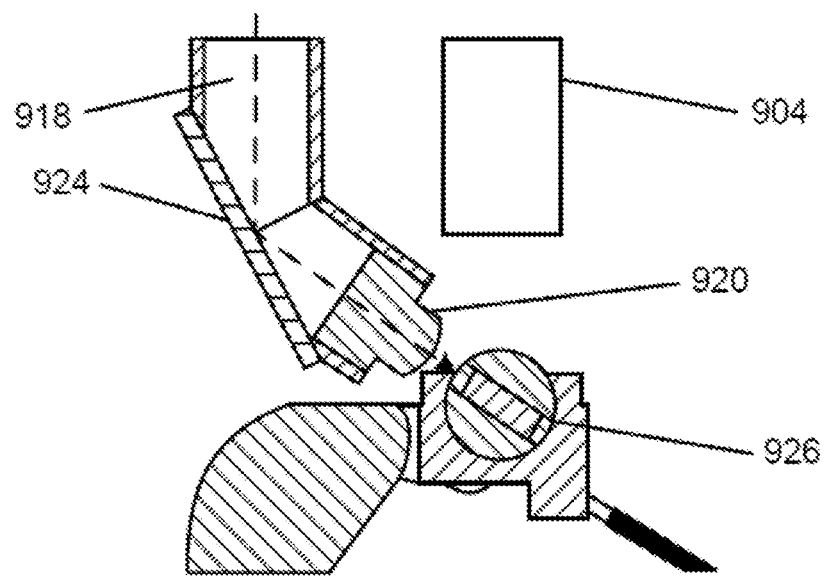

8, and FIG. 9 show examples of stators 804 comprising a gas inlet (spinning gas inlet) 402, 806, 902 and gas exhaust 808. As another example, FIG. 6 demonstrates a spherical rotor spinning stably at greater than 10 kHz.

As another example, FIG. 9 shows a DNP NMR probe. The DNP NMR probe share many of the same components as other NMR probes. The DNP NMR probe can comprise a gas inlet 902, a sample exchange tube 904 (the spherical rotor can be removed through this tube), a spinning gas line 906, a transmit-receive coil 908, a spherical rotor 910, fiber optics 912, a pivot 914, a magic angle adjust 916, a waveguide 918, a microwave lens 920, an RF coil 922, a mirror 924, or a sample/sample chamber 926. Any of one of these features can be combined with any other feature described herein to provide a spherical rotor or spinning system.

The device and methods described herein can be used with solid state, semi-solid state, liquid state, or liquid crystal samples. For example, patient tissue or blood samples can be treated with DNP polarizing agents and isotopically enriched compounds, and clinically relevant biomolecular structures and/or occupation of different carbon pools within cells can be determined. In this way, spherical rotors for MAS NMR experiments can be used in hospitals around the world.

Spherical Rotors

As described herein, the spherical rotors (see e.g., FIG. 1, FIG. 2, FIG. 3) can stably spin at higher frequencies than their cylindrical counterparts. Spherical rotors have improved sample ejection compared to cylindrical rotors. Furthermore, a smaller magnet bore size can be used for spheres (spherical rotors) compared to cylinders (a reduction in bore size can allow for increase in magnetization and enhance sensitivity). The present disclosure provides for spherical rotors spinning at frequencies at least at 80,000 Hz or greater than 80,000 Hz. The spherical rotors can also be spun at less that about 5-6 Kelvin and using less than 2 L of liquid helium per hour.

The present disclosure also provides for spherical rotors which can be scaled down to peripheral diameters of less than 50 microns to access spinning frequencies faster than 200,000 Hz (e.g., during magic angle spinning). Although turbine grooves in conjunction with fluid flow to impart angular momentum are currently employed to supply turbine energy, spherical rotors for MAS NMR experiments can also be rotated by electromagnetic or optical turbine energy.

The present disclosure also provides for cryogenic spinning of the spherical rotors, and illuminating them with microwaves for dynamic nuclear polarization (DNP) experiment to increase signal to noise by more than 100×. The present disclosure provides for spherical rotors spinning at less than 5-6 Kelvin (decrease in temperature can increase sensitivity, especially in DNP) with less than 2 liters per hour of liquid helium (liquid helium is expensive, thus using reduced amounts of liquid helium can be cost saving).

Inspiration to improve MAS instrumentation was found in the planets, stars, and, most notably, pulsars—all possessing large angular momentum. All of these objects share the common feature of being spherical. Accordingly, spherical rotors for MAS were introduced, successfully demonstrating MAS-NMR spectroscopy of samples packed within spherical rotors spinning stably at the magic angle.

These spherical rotors also have superior mechanical strength to cylindrical rotors because the rotor wall can be strengthened selectively at sites of high centrifugal stress. Accordingly, the 9.5 mm outside diameter spherical rotors spun stably at 10,400±1 Hz at the magic angle.

Materials for Spherical Rotor

The spherical rotor can be made of any material suitable for MAS. The examples, herein describe the use of a Zirconia (e.g., yttria-stabilized zirconia ($ZrO_2$)) spinning sphere rotor, but any material suitable for use as a rotor in NMR spectroscopy can be used. For example, other materials of spherical rotors can comprise sapphire, quartz, polymers (plastic), photoresists, or diamond. As another example, the spherical rotor can comprise Boron Nitride, carbon, Teflon™, Zirconia (e.g., $ZrO_2$), Silicon Nitride (e.g., $Si_3N_4$), Macor, Kel-F, Torlon, Aurum, Vespel, or Glass-fiber-reinforced Torlon (GFT).

Spherical rotors comprising diamonds can be hollow diamonds grown on interior spherical substrates, and followed by removal of the interior substrate.

Spherical rotors comprising photoresists or polymers can also be directly 3D printed with the appropriate geometry for sample loading and mechanisms to impart turbine energy.

The present disclosure showed success with zirconia spherical rotors. Described herein are hollow spherical rotors, spherical rotors with a hole down one axis to load samples, and spherical rotors in which the spherical rotors can comprise the material of interest (e.g., the sample). As described herein, the spherical rotors can be a sphere shape or can also be an ellipsoid shape.

For example, the material can comprise diamond. Crystalline carbon has many advantages as rotor material including mechanical strength, thermal conduction, and microwave transparency.

Sample Chamber

One aspect of the present disclosure provides for a magnetic resonance spherical rotor comprising a void or sample chamber suitable for holding a sample. For example, the device can include a sample holder or one or more caps suitable to contain a sample in a sample chamber. The sample volume of the spherical rotor may be increased to the point where the spherical rotor is a hollow shell or a thin hollow shell. The sample chamber can be increased to improve sample filling, yet also provide enough wall thickness to maintain structural integrity under centrifugal stress during spinning. The sample chamber can include a single small entry port for loading of the sample. One end of the sample chamber can be solid to prevent loss of sample during spinning or centrifuge-based sample packing strategies.

The void in the spherical rotor may accommodate a standard cylindrical rotor. For example, rotors used in NMR spectroscopy can comprise materials such as Teflon or Kel-F and can hold from about 12 μL to 50 μL by volume of sample. Typically, the material chosen for the spherical rotor can be that which best matches the magnetic susceptibility of the sample of interest. Typical rotors can spin at about 15 kHz. The spherical rotor described herein can spin anywhere from between about 1 kHz to 500 kHz or more. Recitation of each range is understood to include discrete values within the range.

The sample chamber can be capable of incorporating a sample volume between 0 and 10000 μl. Recitation of each range is understood to include discrete values within the range.

Sample Chamber Cap/Spacer

The spherical rotor can comprise a cap or spacer to contain the sample in the sample chamber. The sample chamber cap(s) or spacer(s) can comprise any material suitable for use in NMR spectroscopy. The cap can be made of any material known in the art to be suitable for NMR spectroscopy. For example, the cap or spacer can be made from the same material as the spherical rotor or a material comprising epoxy, Aurum, plastic, Teflon, Vespel, Kel-F, Glass-fiber-reinforced Torlon (GFT), Torlon, $ZrO_2$, Boron Nitride, carbon, or Macor.

Turbine Grooves, Notches

Spherical rotors have distinct advantages over cylindrical rotors. For example, as described herein, spherical rotors can contain cylindrical sample chambers and equatorial turbine grooves cut into the spherical rotor surface.

As described herein, the spherical rotor includes a plurality of notches or turbine grooves suitable to generate turbine when a gas stream is introduced to the surface. The notches are cut into the surface of the spherical rotor. The notches can be equatorially cut into the surface of the spherical rotor. The notches on the outside ensure that the mass distribution of high-density zirconia is distant from the spinning axis, allowing for the achievement of a large moment of inertia and improves spinning stability. Grooves are machined directly into surface of the spherical rotor, thereby converting the rotor body into a robust turbine with high torque. Converting the zirconia rotor body into a turbine, rather than relying on turbine inserts (or caps as in a conventional cylindrical rotor), delivers an exceedingly robust drive platform with high torque.

The notches or grooves cut into the spherical rotor can be any angle, length or deepness suitable for the rotor to act as a turbine when a fluid gas is introduced to the surface of the spherical rotor.

As an example, FIG. 1 discloses a spherical rotor with equally spaced notches, with a 0.0138 mm deep notch with a 60° notch angle, and a sample chamber radius of 0.1 mm. This example shows the notches at 0.1870 mm apart. As another example, the notches can comprise an angle between 0° and 180°. As another example, the notches can have a depth anywhere between 0 mm and the radius of the spherical rotor minus the radius of the sample chamber. As another example, the distance between the notches can be any distance between two or more notches that are equatorially spaced apart. Recitation of each range is understood to include discrete values within the range.

Size of Spherical Rotor

The spherical rotor can be any size suitable for incorporation of a sample. The spherical rotor can be any size suitable for incorporation of a sample. For example, the spherical rotor can have a diameter between about 1 micron and about 2 mm or between about 2 mm and about 50 mm. Recitation of each range is understood to include discrete values within the range. Smaller diameter size (e.g., 4 mm and 2 mm outside diameters) can increase the spinning frequency (thus, increasing sensitivity of nuclear spin detection).

The sample chamber diameter can be of any size suitable for incorporation of a sample. As an example, the sample volume can be between about 1 μl and 300 μl. As another example, the sample volume can be between about 30 μl and 200 μl. As another example, the diameter of the sample chamber can be between about 1 mm and about 10 mm. As another example, the sample chamber can have a diameter of about 1 mm, about 2 mm, about 3 mm, about 4 mm, about 5 mm, about 7 mm, about 8 mm, about 9 mm, or about 10 mm. Recitation of each of these discrete values is understood to include ranges between each value. Recitation of each range is understood to include discrete values within the range.

Stators

A stator (or stage) can be of any size or shape suitable for incorporation of a spherical rotor. The stator can also comprise one or more gas inlets and one or more exhaust gas outlets. The stator can also incorporate a pivot to adjust the angle of the spherical rotor.

The stator geometries for spherical rotors are also greatly simplified compared to the currently available cylindrical counterpart. The disclosed stator design incorporates only a single gas stream that simultaneously provides bearing gas to reduce friction, propulsion to generate, and maintain angular momentum, and variable temperature control. Introducing this gas stream under the sphere at a specific angle (e.g., 35.3° off of $B_0$) suspends the sphere and rotates the sample at a desired angle (e.g., the magic angle of 54.7°). The stator can comprise between 1 and 256, or more, apertures to introduce spinning gas. Additional apertures can be used to control the angle of the aggregate force imparted on the rotor, and thus the spinning angle.

The stator can also inserted into tubes currently employed in solution state NMR probes. For example, the stator may fit inside an NMR tube, and remain connected to gas lines to provide spinning fluid. As such, the spinning system as described herein may be used in probes intended for solution state, not MAS experiments. As such, the present disclosure provides for a system and apparatus capable of being loaded into a conventional liquid/solution state NMR probe to upgrade/convert any solution state NMR system into an MAS NMR system.

Figure 8A:
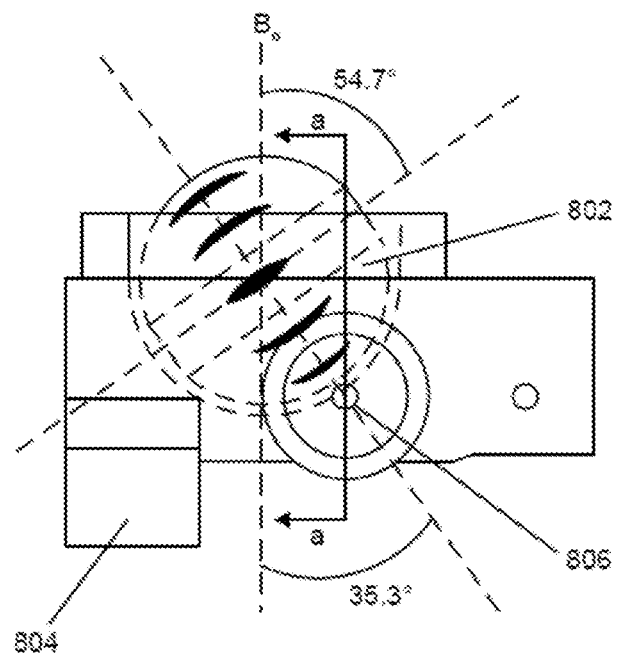
FIG. 8A-FIG. 8D are a series of drawings describing the current stator design with a single gas stream. (A) The gas introduced under the sphere 35.3° off of $B_0$ suspends the sphere and aligns its spinning axis with the magic angle. (B) A section view from (A) shows the gas inlet path and how the gas is directed into the drive cup by a tangent plane. (C and D) Overall flow path of the spinning gas from two separate isometric views.
Figure 8B:
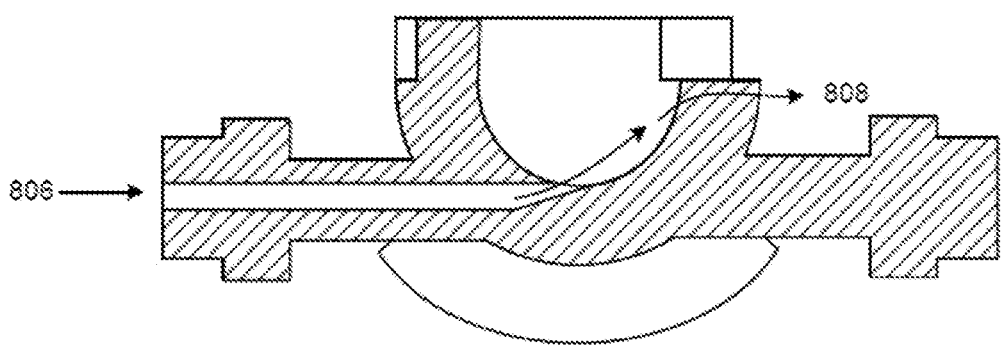
Figure 8C:
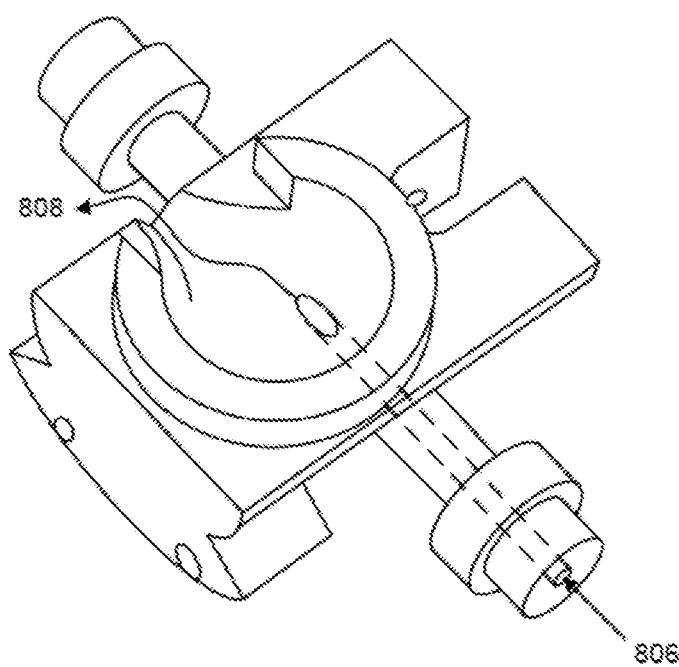
Figure 8D:
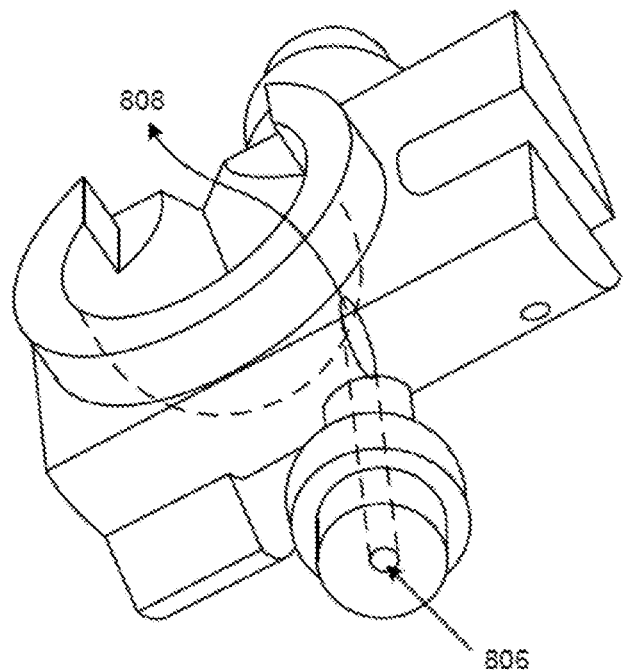

A plane at the end of the gas inlet, which is tangent to the hemispherical drive cup can guide the spinning gas into the stator (see e.g., FIG. 8B). The spinning gas can then exit through the exhaust gas outlet opposite of the gas inlet. The gas inlet and exhaust gas outlet can be designed in a common plane that is perpendicular to the spinning axis of the rotor (see e.g., FIG. 8C and FIG. 8D showing the flow path of the spinning gas through the stator).

Many modifications to the gas stream orientation can be made in the specific embodiments that are disclosed and still obtain a like or similar result without departing from the spirit and scope of the present disclosure, including modifications to change or vary the spinning angle. This simplified stator design has enabled the fabrication of over 250 stators utilizing additive manufacturing (3D printing).

One or more extrusions (or blind holes) can be added to the stator. The extrusions can incorporate sensors, for example, to accept fiber optics for spinning frequency detection.

A heating element, such as a nichrome wire can be incorporated in the gas inlet or the inlet gas stream to control the air temperature.

A cooling element can also be incorporated into the system. For example, a fluid line can be incorporated for cooling of the fluid (e.g., gas) and spherical rotor to a temperature of less than about 4.22K or less than about 2.23 K, resulting in a superfluid zero viscosity phase of helium.

A temperature sensor can also be incorporated into the system.

The entire stator and probe can also be submerged in superfluid, or fluid, helium for cooling and to reduce friction.

The entire stator and probe head can also be evacuated, with turbine energy being supplied a low-flow of gas, by electromotive energy, or by optical energy. Size of Stator The size of the stator can be any size suitable for the incorporation of the spherical rotor. The stators for the spherical rotors can be scaled down to <0.5 mm using micro-fabrication. For example, the stator can house rotors between the sizes of 50 microns to 500 microns. In another example, the stator may house rotors between 0.5 mm to 50 mm. Recitation of each of these discrete values is understood to include ranges between each value. Recitation of each range is understood to include discrete values within the range.

A "NanoScribe" 3D printer has 100 nM resolution and is capable of producing ultra small stators.

Materials for Stator

The stator can also be made of any material suitable for use as a stator. For example, the stator can comprise a polymer (for example polymers used in 3D printing such as acrylonitrile-butadiene-styrene material) or the same material as the spherical rotor (e.g., Boron Nitride, carbon, Teflon™, Zirconia (e.g., $ZrO_2$), Silicon Nitride (e.g., $Si_3N_4$), Macor, Kel-F, Torlon, Aurum, Vespel, Glass-fiber-reinforced Torlon (GFT), diamond).

Probe

The spherical rotor, as described herein, can be incorporated into a nuclear magnetic resonance (NMR) probe. NMR probes are devices suitable for insertion into an NMR magnet and equipped with a radiofrequency (RF) transmit-receive coil to transmit RF signal into a sample and receive a resulting RF signal from nuclear spins in the sample. For example, the probe can comprise a radio frequency coil (e.g., a transmit-receive coil), capable of transmitting and receiving a radiofrequency, and suitable for incorporating a spherical rotor.

As another example, the probe can include a gas inlet for use as a fluid to spin the spherical rotor. A gas stream can provide bearing gas to reduce friction, drive propulsion to generate and maintain angular momentum. The gas line can also incorporate heating element to control the temperature.

NMR probes can be equipped with auxiliary components, such as a variable angle adjuster, a cryostat for cryogenic NMR, a sample exchange tube, a waveguide for DNP, a microwave lens, fiber optics to measure the spinning frequency, or a MAS/VAS control unit.

As another example, the spherical rotor and stator as described herein can be incorporated into an existing probe, such as a solid state (SS) probe, a liquid state probe, a dynamic nuclear polarization (DNP) probe (see e.g., FIG. 9), or a cryoprobe. The probe can also incorporate a pivot or variable angle adjuster to adjust the angle of the stator (stage) and spherical rotor. In another example, spherical rotor and stator, as described herein, can be incorporated into an existing probe, wherein the probe can be designed either for liquid samples (solution NMR) or solid samples (solid state NMR).

As described herein, the sample exchange process for a spherical rotor greatly simplifies the sample exchange process when compared to the standard cylindrical rotor, in which the angle needs to be readjusted or recalibrated each time the sample is exchanged. The spherical rotor can be simply ejected and replaced without requiring an angle adjustment or recalibration. The sample exchange system can comprise a vacuum line or an air line suitable to extract the spherical rotor from the probe and magnet.

The probe coil can be selected from any RF transmit-receive coil capable of transmitting and receiving NMR signal. For example, the probe can incorporate a multiple-resonant radio frequency circuit to implement with the spherical rotors. For example, the RF transmit-receive coil can be a split solenoid sample coil (e.g., a four-turn split solenoid wrapped around the stator). The RF transmit-receive inductor can also be, but is not limited to, a standard solenoid, a variable pitch solenoid, a saddle coil (single or multi-turn), a Helmholtz coil, or a birdcage coil. The coil can be large enough for vertical access of the spherical rotor or smaller to incorporate the spherical rotor without room for ejection to enhance sensitivity. The probe can also incorporate microwave irradiation for DNP.

Spherical Rotor Spinning

Any method known in the art can be used for spinning the spherical rotor. For example, the spherical rotor can be spun with a fluid (e.g., gas); an electro, magnetic, or electromagnetic field; or light (e.g., circularly polarized light).

Figure 13:
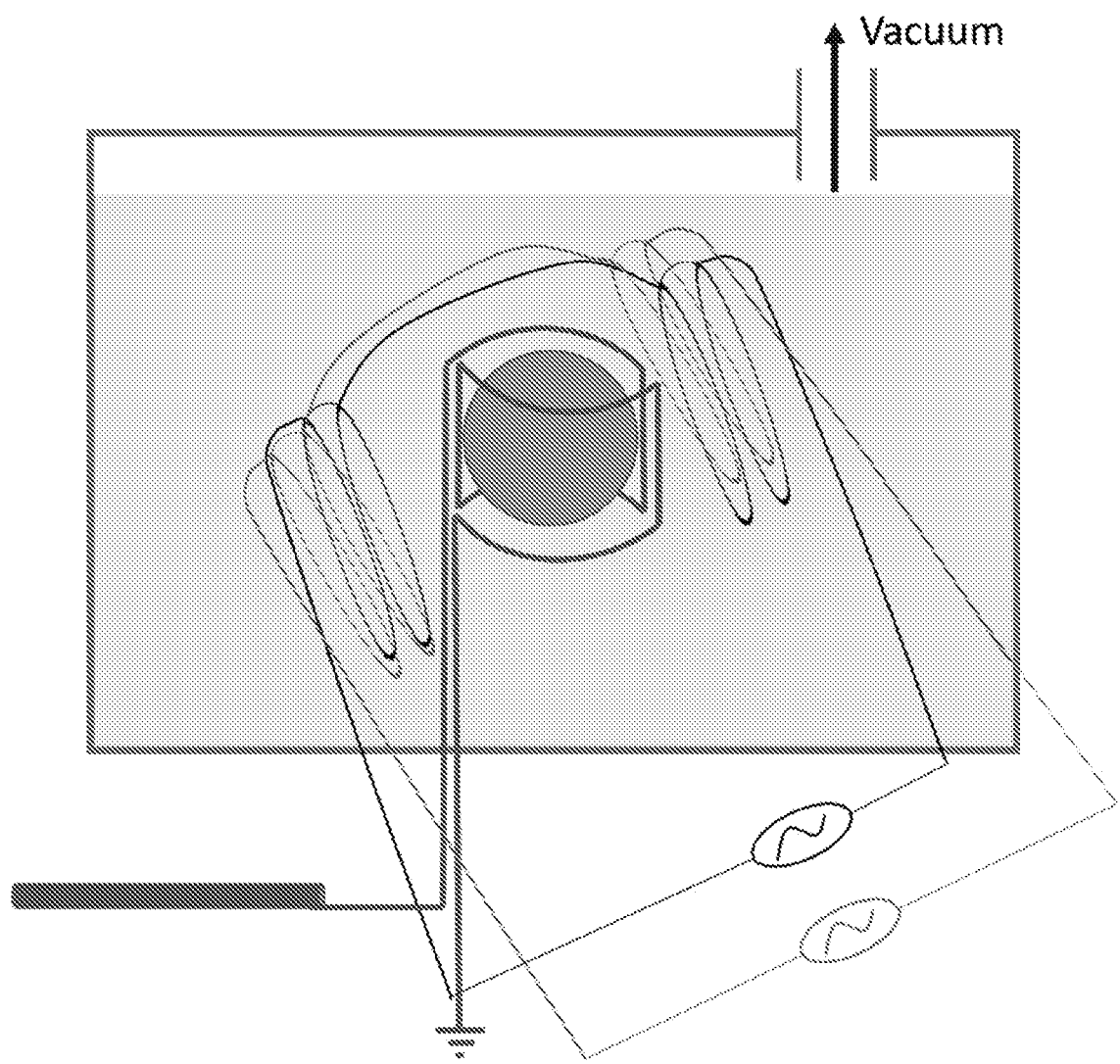
FIG. 13 is an illustration of a system including two split solenoid coils positioned on either side of the magic angle to allow for spinning propulsion with concomitant fine adjustment of the spinning angle of the spherical rotor.

Spinning cylinders around their short axes, as in current MAS experiments, can be inherently unstable and can limit the maximum spinning frequency in MAS. Recently, magic angle spinning spheres have been implemented to improve the spinning stability, increase the maximum spinning frequency, and decrease the number of gas streams needed for magic angle spinning. Disclosed herein is a technology to spin spherical rotors at the magic angle using an electric field (see e.g., FIG. 13) as opposed to conventional spinning with nitrogen or helium gases. This system includes two split solenoid coils positioned on either side of the magic angle to allow for spinning propulsion with concomitant fine adjustment of the spinning angle of the spherical rotor.

Spinning of the spherical rotor can comprise (i) facile polarization of a spherical rotor, allowing for spinning propulsion; (ii) "phase locking" of the spinning system to allow for unprecedented spinning stability; (iii) facile integration of a cooling "bath" to achieve spinning at cryogenic temperatures between about 1.2 Kelvin and about 200 Kelvin; or (iv) facile introduction of a vacuum to (iii) to achieve cryogenic temperatures below 2.23 K.

As an example, the spherical spinning apparatus as described herein can comprise electret-driven magic angle spinning. For example, the spherical rotors can be employed in a spinning apparatus for magnetic resonance experiments which delivers power to an electrostatic dipole (as known as an electret) to provide angular momentum (also known as turbine or drive) to rotors in magnetic resonance experiments. Electrets are a type of electric motor that can employ a static electric dipole (rather than a magnetic dipole) within rotors and an external fluctuating electromagnetic field (alternating current, AC) to provide power for mechanical motion. Electrets are well-known in the art and are now commonly used in many applications and can provide continuous rotation (see e.g., U.S. Pat. Nos. 3,696,258 and 7,196,521; Stong, 1968, How to make electrets, devices that hold electrostatic charge, Scientific American). Except as otherwise noted herein, therefore, the process of the present disclosure can be carried out in accordance with such processes.

Electrets are preferred in magnetic resonance experiments compared to magnetic dipoles because the rotors are placed in high (>1 Tesla) magnetic fields for experiments.

Such static electric dipoles have already been employed in magic angle spinning (MAS) NMR experiments to measure the spinning frequency (U.S. Pat. No. 7,196,521 to Doty). Whereas the '521 patent employs electrets for the measurement of the spinning frequency with an antenna, this disclosure provides for using electrets and a driven external fluctuating magnetic field to provide turbine energy for angular propulsion.

The static electric dipole of the rotor can be created by applying a static electric field to a sample containing mobile ions, followed by freezing the sample to "trap" the separated positive and negative charges. The static electric dipole of the rotor can also be an electret insert of a ceramic, or other material, which has an intrinsic dipole moment.

The fluctuating electromagnetic (AC) field can be generated by two, or more, metallic or conductive elements, which are in the vicinity of or near the rotor. The electrical potential on these elements can be controlled in a time-dependent fashion such an electrical potential results which drives the rotor. The AC field can also be generating by a solenoid or other inductor in the vicinity of or near the rotor, which is connecting to an AC power supply, which also results in a time dependent electrical potential which exerts torque on the rotor.

The interaction of the static electric dipole with the external driving AC potential can also be used to heat the sample.

The electric field interaction can also be used to hold the rotor in place. In one example, the rotor can have a net negative electric potential, and an element under the rotor can also have a negative potential, resulting in a repulsive force, which holds the rotor in place for spinning experiments.

Kits

Also provided are kits. Such kits can include the device and components described herein and, in certain embodiments, instructions for use. Such kits can facilitate performance of the methods described herein. Components include, but are not limited to a spherical rotor, a stator, caps, sample holders, a probe, an RF coil, or sample packing tools.

In certain embodiments, kits can be supplied with instructional materials. Instructions may be printed on paper or other substrate, and/or may be supplied as an electronic-readable medium, such as a floppy disc, mini-CD-ROM, CD-ROM, DVD-ROM, Zip disc, videotape, audio tape, and the like. Detailed instructions may not be physically associated with the kit; instead, a user may be directed to an Internet web site specified by the manufacturer or distributor of the kit.

Definitions and methods described herein are provided to better define the present disclosure and to guide those of ordinary skill in the art in the practice of the present disclosure. Unless otherwise noted, terms are to be understood according to conventional usage by those of ordinary skill in the relevant art.

In some embodiments, numbers expressing quantities of ingredients, properties such as molecular weight, reaction conditions, and so forth, used to describe and claim certain embodiments of the present disclosure are to be understood as being modified in some instances by the term "about." In some embodiments, the term "about" is used to indicate that a value includes the standard deviation of the mean for the device or method being employed to determine the value. In some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the present disclosure are approximations, the numerical values set forth in the specific examples are reported as precisely as practicable. The numerical values presented in some embodiments of the present disclosure may contain certain errors necessarily resulting from the standard deviation found in their respective testing measurements. The recitation of ranges of values herein is merely intended to serve as a shorthand method of referring individually to each separate value falling within the range. Unless otherwise indicated herein, each individual value is incorporated into the specification as if it were individually recited herein.

In some embodiments, the terms "a" and "an" and "the" and similar references used in the context of describing a particular embodiment (especially in the context of certain of the following claims) can be construed to cover both the singular and the plural, unless specifically noted otherwise. In some embodiments, the term "or" as used herein, including the claims, is used to mean "and/or" unless explicitly indicated to refer to alternatives only or the alternatives are mutually exclusive.

The terms "comprise," "have" and "include" are open-ended linking verbs. Any forms or tenses of one or more of these verbs, such as "comprises," "comprising," "has," "having," "includes" and "including," are also open-ended. For example, any method that "comprises," "has" or "includes" one or more steps is not limited to possessing only those one or more steps and can also cover other unlisted steps. Similarly, any composition or device that "comprises," "has" or "includes" one or more features is not limited to possessing only those one or more features and can cover other unlisted features.

All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the present disclosure and does not pose a limitation on the scope of the present disclosure otherwise claimed. No language in the specification should be construed as indicating any non-claimed element essential to the practice of the present disclosure.

Groupings of alternative elements or embodiments of the present disclosure disclosed herein are not to be construed as limitations. Each group member can be referred to and claimed individually or in any combination with other members of the group or other elements found herein. One or more members of a group can be included in, or deleted from, a group for reasons of convenience or patentability. When any such inclusion or deletion occurs, the specification is herein deemed to contain the group as modified thus fulfilling the written description of all Markush groups used in the appended claims.

All publications, patents, patent applications, and other references cited in this application are incorporated herein by reference in their entirety for all purposes to the same extent as if each individual publication, patent, patent application or other reference was specifically and individually indicated to be incorporated by reference in its entirety for all purposes. Citation of a reference herein shall not be construed as an admission that such is prior art to the present disclosure.

Having described the present disclosure in detail, it will be apparent that modifications, variations, and equivalent embodiments are possible without departing the scope of the present disclosure defined in the appended claims. Furthermore, it should be appreciated that all examples in the present disclosure are provided as non-limiting examples.

EXAMPLES

The following non-limiting examples are provided to further illustrate the present disclosure. It should be appreciated by those of skill in the art that the techniques disclosed in the examples that follow represent approaches the inventors have found function well in the practice of the present disclosure, and thus can be considered to constitute examples of modes for its practice. However, those of skill in the art should, in light of the present disclosure, appreciate that many changes can be made in the specific embodiments that are disclosed and still obtain a like or similar result without departing from the spirit and scope of the present disclosure.

Example 1: Zirconia Spherical Spinner

The following example describes a spherical spinner 3D printed from zirconia (a spherical rotor). The spherical rotor was placed in a stator (a stage). The stator (e.g., a flat panel with a hole or semicircular divot suitable for the size of the spherical rotor) with an air line coupled to the stage facilitated the spinning of the spherical rotor. Air flowed through the air line and spun the sample with stability (in this example, at least up to 14.5 kHz).

FIG. 1 is a series of images showing the design of an embodiment of the spherical spinner. FIG. 2 is a series of images showing stills of a video showing the spherical sample holder spinning at 0 Hz (see e.g., FIG. 2A) and at approximately 6 kHz (with a max speed 14.5 kHz) (B). Air is blown through the tube to spin the sphere. Stability is noted by black stripe down the center of the sphere (see e.g., FIG. 2B).

Example 2: Spinning Spheres (Spherical Rotors)

The following example describes the design of spherical rotors and stators and experiments using the spherical rotors and stators in NMR spectroscopy.

Magic angle spinning (MAS) is commonly used in nuclear magnetic resonance of solids to improve spectral resolution. Rather than using cylindrical rotors for MAS, here it is demonstrated that spherical rotors can be spun stably at the magic angle. Spherical rotors conserve valuable space in the probe head and simplify sample exchange and microwave coupling for dynamic nuclear polarization (DNP). In this current implementation of spherical rotors, a single gas stream provides bearing gas to reduce friction, drive propulsion to generate and maintain angular momentum, and variable temperature control for thermosetting. Grooves are machined directly into zirconia spheres, thereby converting the rotor body into a robust turbine with high torque. Demonstrated here, 9.5-mm-outside diameter spherical rotors can be spun at frequencies up to 4.6 kHz with $N_2$ (g) and 10.6 kHz with He(g). Angular stability of the spinning axis is demonstrated by observation of $^{79}$Br rotational echoes out to 10 ms from KBr packed within spherical rotors. Spinning frequency stability of ±1 Hz is achieved with resistive heating feedback control. A sample size of 36 µl can be accommodated in 9.5-mm-diameter spheres with a cylindrical hole machined along the spinning axis. It was further shown that spheres can be more extensively hollowed out to accommodate 161 µl of the sample, which provides superior signal-to-noise ratio compared to traditional 3.2-mm-diameter cylindrical rotors.

The long, narrow cylindrical shape of conventional rotors and the necessity for them to rotate at the magic angle complicate the sample exchange process. Sample exchanges for cylindrical rotors mandate an angle adjustment of either the rotor or the stator for insertion or ejection within the magnet bore. This alignment typically requires considerable space within the magnet (30). Furthermore, cylindrical rotors for cryogenic MAS dynamic nuclear polarization (DNP) is the technique used in these experiments, aimed at improving NMR signal-to-noise ratio, present significant challenges to microwave coupling into the sample (31-33).

As described herein are methods to improve MAS instrumentation to simplify sample exchange, improve DNP, reduce cryogen usage, and access spinning frequencies >150 kHz (34). Macroscopic metallic spherical rotors have been spun up to 667 kHz using electromagnetic bearings and drive energy (35). Although this technology would not be directly translated into MAS within superconducting magnets (due to the magnetic susceptibility mismatch of the metallic spinning spheres), the fact that macroscopic spheres can be spun effectively is important and exploitable. As such, spherical rotors for MAS were envisioned.

Spherical rotors have distinct advantages over cylindrical rotors. Wobbling about the long axis of cylindrical rotors results in bearing collisions that can destroy the sample and stator. The isotropic spherical rotor alleviates these issues, because wobbling about an axis other than the primary spinning axis does not result in stator collisions. Furthermore, this implementation of a spherical rotor enables a simplified vertical sample exchange while providing better access for microwave illumination. As described herein are spherical rotors for MAS and the demonstration of MAS NMR spectroscopy of samples packed within spherical rotors spinning stably at the magic angle.

Materials and Methods

Commercial sources of relatively low-cost, high-precision spheres are available as industrial lubricants and ball bearings. Sample chambers were machined with 36- or 161-µl sample chamber volume into yttria-stabilized zirconia ($ZrO_2$) solid spheres with a diameter of 9.525 mm (FIG. 3B and FIG. 3C). Twelve turbine grooves were cut into the spherical rotor longitudinally (O'Keefe Ceramics). Kel-F spacers and epoxy were used to seal the sample chambers (FIG. 3B and FIG. 3C). Stators to house the spherical rotors were three-dimensionally (3D) printed from an acrylonitrile-butadiene-styrene material (Form 2 SLA printer, Clear V4 Resin, Formlabs).

All experiments were performed at a $B_0$=7.05 T corresponding to a $^{79}$Br Larmor frequency of 75.214 MHz. Spectra were recorded with a custom-built, two-channel, transmission line probe resonating a split solenoid sample coil. A Bloch decay with a pulse length of 20 µs was used for spherical rotors, with a 1-s recycle delay. Spinning frequencies were measured on a testing apparatus outside the magnet with an LT-880 laser tachometer (Terahertz Technologies Inc.), as shown in FIG. 5. Spinning frequencies during the NMR experiments were measured with fiber optics and a MAS control unit (Tecmag).

Results and Discussion

Spherical Rotor Design

Figure 6:
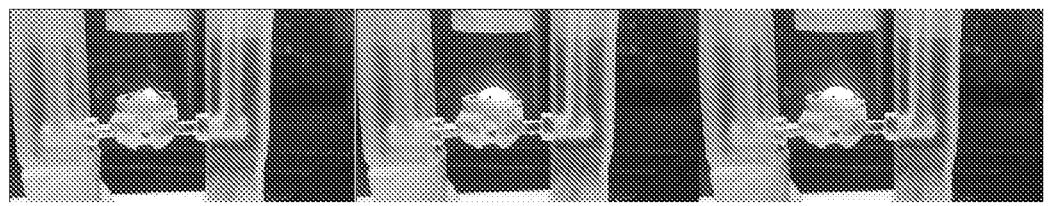
FIG. 6 is a series of stills from a movie showing a spherical rotor (9.5 mm) spinning stably at magic angle in a 3D-printed stator.

The spherical rotors contain cylindrical sample chambers and equatorial turbine grooves cut into the surface of the rotor. A large moment of inertia and improved spinning stability are achieved by ensuring that the mass distribution of high-density zirconia is distant from the spinning axis. The 36-µl sample chamber in spherical rotors matches the 3.2-mm cylindrical rotor (FIG. 3A and FIG. 3B), and the 9.5-mm-peripheral diameter rotors were further hollowed out to accommodate 161 µl of the sample (FIG. 3C). Converting the zirconia rotor body into a turbine, rather than relying on turbine inserts, delivers a robust drive platform with high torque. The combination of cylindrical sample chambers and grooves establishes a preferred axis of rotation about a single axis (FIG. 3B and FIG. 3C). This allows for the spherical rotor to be inserted at arbitrary orientations within the stator (FIG. 6). When spinning gas is applied, the sphere quickly samples different orientations until rotation about the preferred axis is established.

Stator for Spherical Rotor

Figure 7:
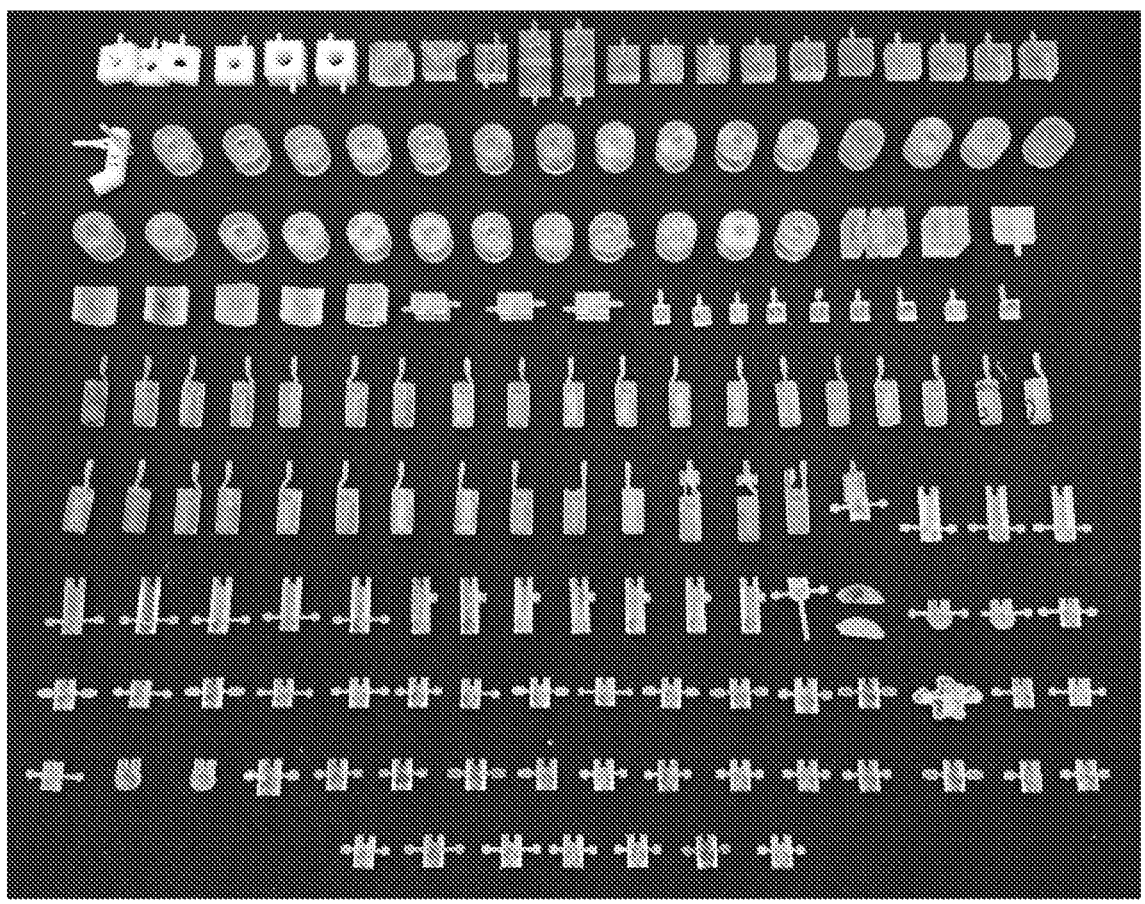
FIG. 7 is an image of 3D printed stators for spherical rotors. This figure shows a selection of the 232 different stators that were designed, printed, and evaluated experimentally for optimal spinning at the magic angle.

Prototyping stator geometries with 3D printing greatly accelerated the production of a successful stator design (FIG. 7). Here, relatively large dimensions (9.5 mm diameter) were chosen to leverage rapid prototyping with resolution readily available for 3D printing. For instance, 232 stators were printed and tested to spin spherical rotors. Spinning performance is expected to improve as the fluid flow is further optimized within precision-fabricated stators.

FIG. 4 shows a selection of four stator designs that demonstrate progression to the current implementation. Initially, the stator was enclosed, and multiple gas streams (FIG. 4A), comparable to bearings and drive cups within cylindrical MAS stators, were used. However, these designs were not as stable due to poor fluid flow dynamics. Simplification of the design to a single gas stream resulted in spinning about a single axis. Spinning stability with the single-stream stator was greatly improved by adding a pathway to guide the exhausting gas (FIG. 4B). Positioning the gas inlet aperture within the hemispherical stator at the complement to the magic angle resulted in stable MAS (FIG. 4C). In addition, FIG. 4D shows a vertical extrusion of 2 mm that improves fluid flow, resulting in faster spinning. Blind holes for fiber optics pass sufficient light to enable spinning frequency detection without affecting fluid flow (FIG. 4D).

The current stator design (FIG. 4D and FIG. 8) incorporates only a single gas stream, which simultaneously provides bearing gas to reduce friction, propulsion to generate and maintain angular momentum, and variable temperature control for thermosetting. Introducing this gas stream under the sphere 35.3° off of $B_0$ suspends the sphere and generates rotation of the sample at the magic angle of 54.7° (FIG. 8A). A plane at the end of the gas inlet, which is tangent to the hemispherical drive cup, guides the spinning gas into the stator (FIG. 8B). The spinning gas then exits through the exhaust gas outlet opposite of the gas inlet. The gas inlet and exhaust gas outlet were designed in a common plane that is perpendicular to the spinning axis of the rotor. FIG. 8C and FIG. 8D shows the flow path of the spinning gas through the stator.

NMR Probes

The transmit-receive coil is a four-turn split solenoid wrapped around the stator. This design allows vertical access to the sample, albeit with decreased NMR sensitivity due to a low filling factor. Stators were designed to be compatible with current NMR probes in the lab. The design interfaces to an adjustment apparatus for magic angle optimization and also improves microwave illumination for DNP (FIG. 9). Implementation of spherical rotors simplified sample exchange by allowing vertical access to the sample. This eliminated the need for rotation of either the rotor or the stator before sample exchange, as is necessary for cylindrical rotors (30). The sample exchange described herein mimics systems typically used in solution NMR instrumentation. A simple tube connected to a wet/dry vacuum (model 3VE20, Dayton Electric Mfg. Co.) was used to extract and insert the sphere. With minor adjustments, this new compact MAS NMR stator and rotor design can be implemented in a wide variety of NMR probes for both narrow and wide bore magnets.

Figures 10A, 10B, 10C, 10D, 10E, 10F:
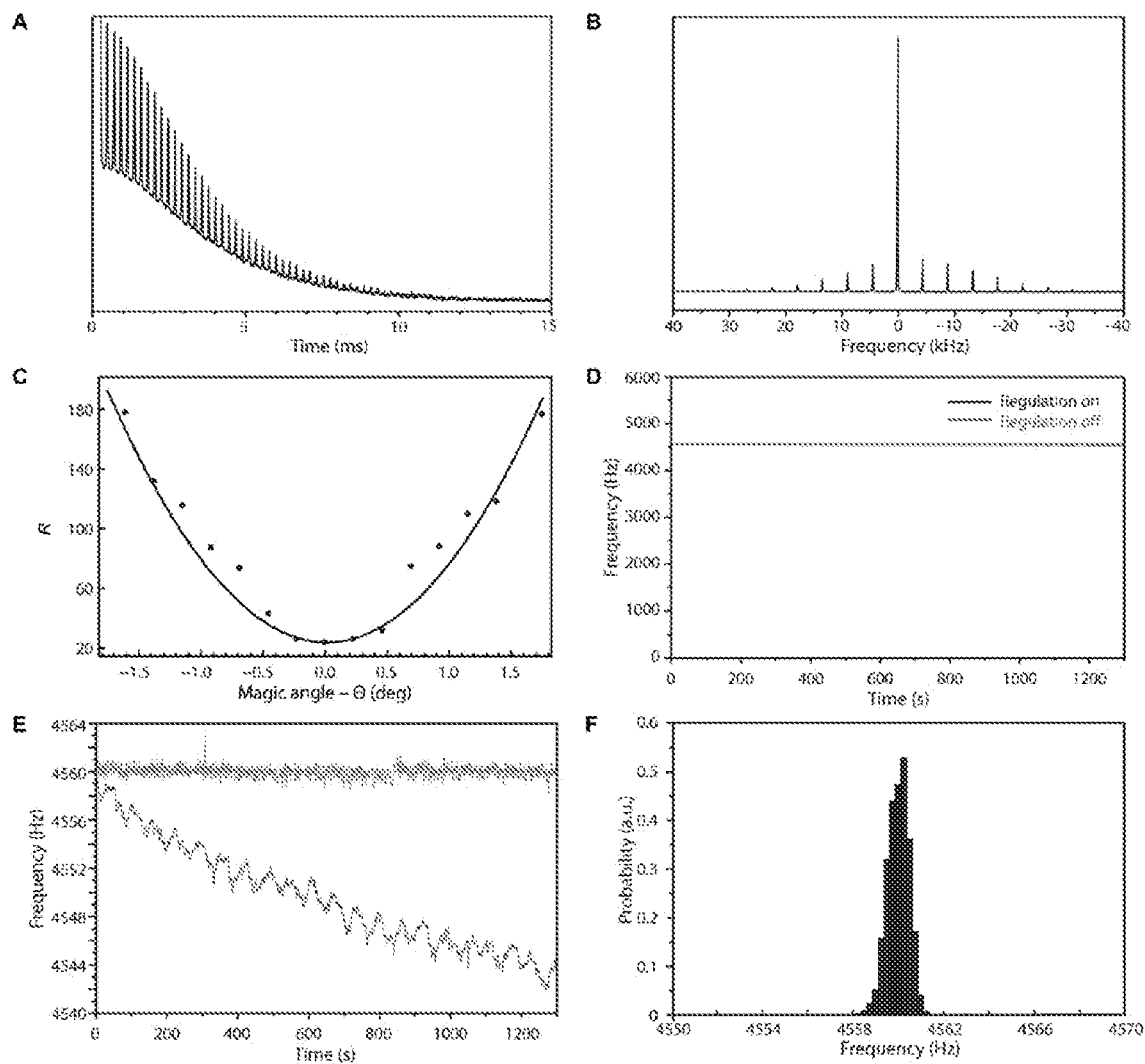
FIG. 10A-FIG. 10F is a series of graphs showing magic angle adjustment and spinning stability regulation of MAS with spherical rotors. $^{79}$Br magnetic resonance of a MAS spherical rotor packed with KBr. (A) Free induction decay of 64 transients with rotational echoes observed out to 10 ms. (B) Spinning sidebands in the frequency domain indicate spinning of 4.3 kHz stably at the magic angle. (C) Optimization of the magic angle at a spinning frequency of 2.5 kHz. The height ratio (R) of the center band peak relative to the second sideband decreases as the angle of rotation approaches 54.7° from $B_0$ (36). (D) Spinning frequency stability over 22 min with and without spinning regulation controlled through a resistive heating element circuit. (E) Expansion of spinning frequency shows moderate excursion in spinning frequency of less than 20 Hz without regulation and improved frequency stability with regulation. (F) Histogram of spinning frequencies showing the rotor spinning at 4560±1 Hz for 98% of the 22 min observed. a.u., arbitrary units.

Results with KBr $^{79}$Br yields quadrupolar spinning sidebands that are used to optimize the magic angle (36). Rotational echoes were observed at 10 ms in the time domain (FIG. 10A). The Fourier transform of the signal showed sidebands separated by the spinning frequency of 4297 Hz (FIG. 10B). The central resonance had a width of 123 Hz at half height, while the first sideband had a width of 143 Hz at half height, indicating spinning closely matching to 54.7° off the $B_0$ magnetic field. FIG. 10C shows peak height ratios of the center band and second sidebands versus deviation from the magic angle, similar to the description by Frye and Maciel (36). The relative height of the center band compared to the sidebands decreases as the angle of rotation approaches the magic angle. FIG. 10C indicates the ability to optimize the magic angle in MAS NMR experiments. FIG. 10D and FIG. 10E shows the regulated and unregulated spinning frequency over 22 min. Regulation of spinning frequency used a 12-ohm nichrome wire heating element to regulate the gas temperature (FIG. 5) (37). FIG. 10F indicates that 98% of the frequencies measured fall within 4560±1 Hz. This frequency regulation system can improve spinning stability in the spheres.

Figures 3D, 3E, 3F:
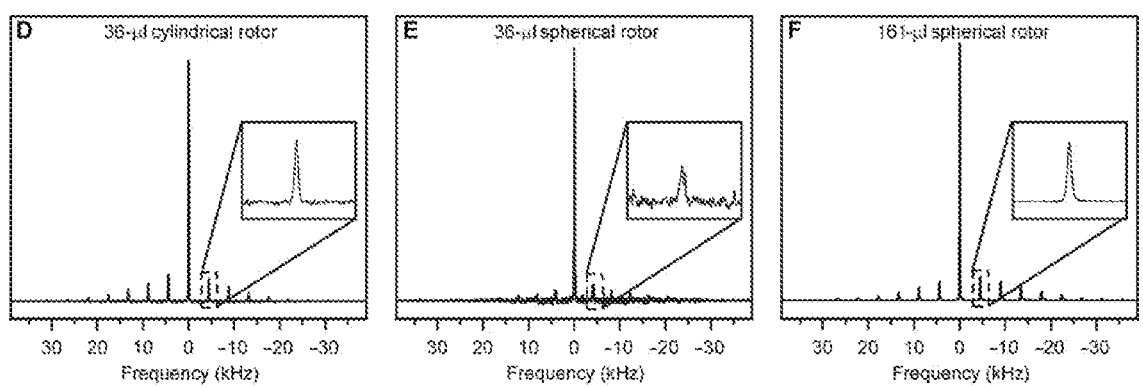
FIG. 3D-FIG. 3F are NMR spectra showing the first-order sidebands in $^{79}$Br spectra of KBr used to analyze NMR sensitivity of (D) 3.2-mm cylindrical rotors, (E) 36 µl spherical rotors, and (F) 161 µl spherical rotors. Each spectrum is an average of 256 transients.

The first-order sidebands in $^{79}$Br spectra of KBr were used to compare NMR sensitivity of three MAS rotor geometries: a 3.2-mm cylindrical rotor, a 36-µl spherical rotor, and a 161-µl spherical rotor (FIG. 3D to FIG. 3F). Each spectrum is an average of 256 transients. Although the filling factor of the spherical rotors in a split solenoid coil is not ideal, the 161-µl spherical rotor yields better signal-to-noise ratios than the 3.2-mm cylindrical rotor.

Figure 11:
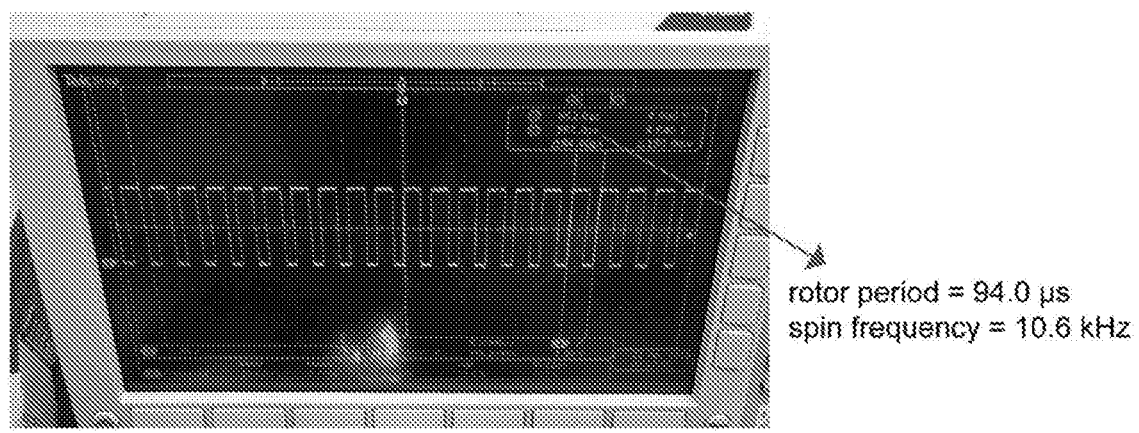
FIG. 11 is an image of showing the spherical rotor spun at 10.6 kHz with helium gas.

Also investigated were the mechanical advantages imparted by the spherical shape of the rotors through further increasing centrifugal forces from spinning. Helium gas at high pressure resulted in >10 kHz spinning of the 9.5 mm-diameter spherical rotors. Rotors within the stator design shown in FIG. 4D and FIG. 8 were spun to 10.6 kHz using 11-bar He(g) on a testing apparatus outside the magnet (FIG. 11). The sphere maintained spinning stability above 10 kHz, similar to that demonstrated in FIG. 10D. This observation provides promise that, with further optimization of fluid flow and scaling to smaller sizes, spinning frequencies of >150 kHz can be achieved.

Rapid Prototyping by 3D Printing

Stators that house the spherical rotors and provide fluid dynamics suitable for high-frequency stable magic angle spinning (MAS) were 3D printed (Form2 SLA printer, Formlabs, Somerville, Mass.). 3D printing permitted rapid prototyping and greatly accelerated this initial design phase. 232 stators were designed, fabricated, and tested as shown in FIG. 7 which displays various stages of the designs. The goal of this rapid prototyping was to design a stator that provides stable MAS, spinning frequency detection, and sample ejection for spherical rotors.

MAS Test Station for 3D Printed Stators

Figures 5A, 5B, 5C:
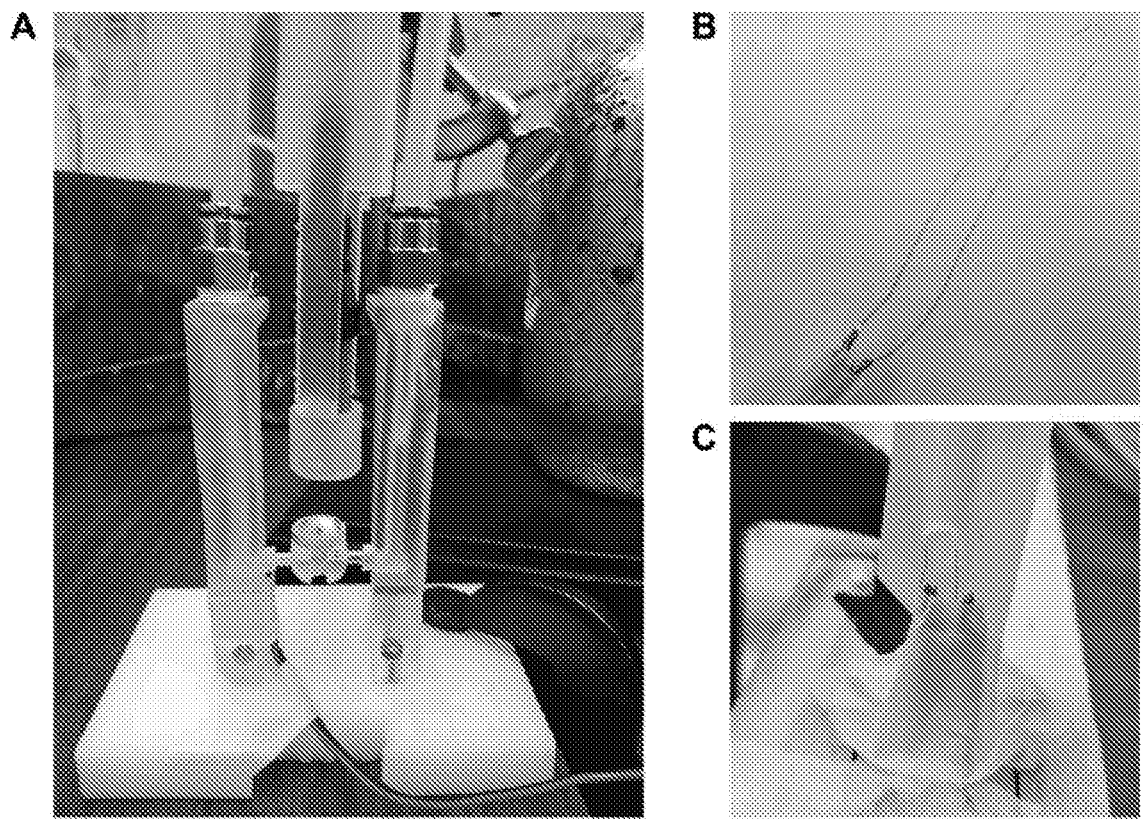
FIG. 5A-FIG. 5C are images of a spinning test station for spherical rotors in 3D-printed stators. (A) Spinning test station. The spherical rotor and the stator were connected to the stator legs where the gas was introduced. The sensor head of the LT-880 laser tachometer was installed from the top to detect the spinning frequency. (B) Nichrome wire for heating of the gas for spinning regulation. (C) The nichrome wire was installed on the gas inlet.

Spherical rotor frequencies were detected with a LT-880 laser tachometer (Terahertz Technologies Inc., Oriskany, N.Y.) which was connected to an oscilloscope (Tektronix MDO3034). To improve spinning stability regulation, four marks were placed on the spherical rotor instead of one (FIG. 5A). A 12Ω nichrome wire was installed on the gas inlet to heat the gas for spinning regulation (37) (FIG. 5B-FIG. 5C).

MAS (10.6 kHz) with Helium Gas

With the current stator design (FIG. 4D and FIG. 8) and test station shown in FIG. 5, a spinning frequency of 10.6 kHz was demonstrated outside the magnet using 160 psi of helium gas (FIG. 11).

Spinning Frequency Reproducibility

In order to ensure spinning frequency reproducibility, multiple spherical rotors and multiple copies of the stator were tested. Four different spherical rotors were tested with the same stator, as shown in TABLE 1. The spinning stability of less than 5 Hz for rotors tested demonstrates that spinning frequency and spinning stability did not depend on packing inconsistency to a substantial extent. Eleven different copies of the same stator were tested with one spherical rotor (TABLE 2). The spinning stability for ten of the eleven stator copies is less than 2 Hz, indicating excellent reproducibility of the 3D printed design.

TABLE 1

Spinning test with same stator and different spherical rotors.

|  | Pressure (psi) | Frequency (Hz) |
| --- | --- | --- |
| Spherical rotor #1 | 85 | 5508 ± 2 |
| Spherical rotor #2 | 90 | 5478 ± 3 |
| Spherical rotor #3 | 90 | 5446 ± 1 |
| Spherical rotor #4 | 90 | 5540 ± 5 |

TABLE 2

Spinning test with same spherical rotor and different stator copies.

|  | Pressure (psi) | Frequency (Hz) |
| --- | --- | --- |
| Stator copy #1 | 85 | 5508 ± 2 |
| Stator copy #2 | 90 | 5628 ± 2 |
| Stator copy #3 | 90 | 5290 ± 2 |
| Stator copy #4 | 90 | 5189 ± 1 |
| Stator copy #5 | 90 | 5541 ± 1 |
| Stator copy #6 | 90 | 5414 ± 5 |
| Stator copy #7 | 90 | 5444 ± 1 |
| Stator copy #8 | 90 | 5245 ± 2 |
| Stator copy #9 | 90 | 5476 ± 1 |
| Stator copy #10 | 90 | 5473 ± 1 |
| Stator copy #11 | 90 | 5493 ± 1 |

Correlation Between Temperature and Spinning Frequency

Figure 12:
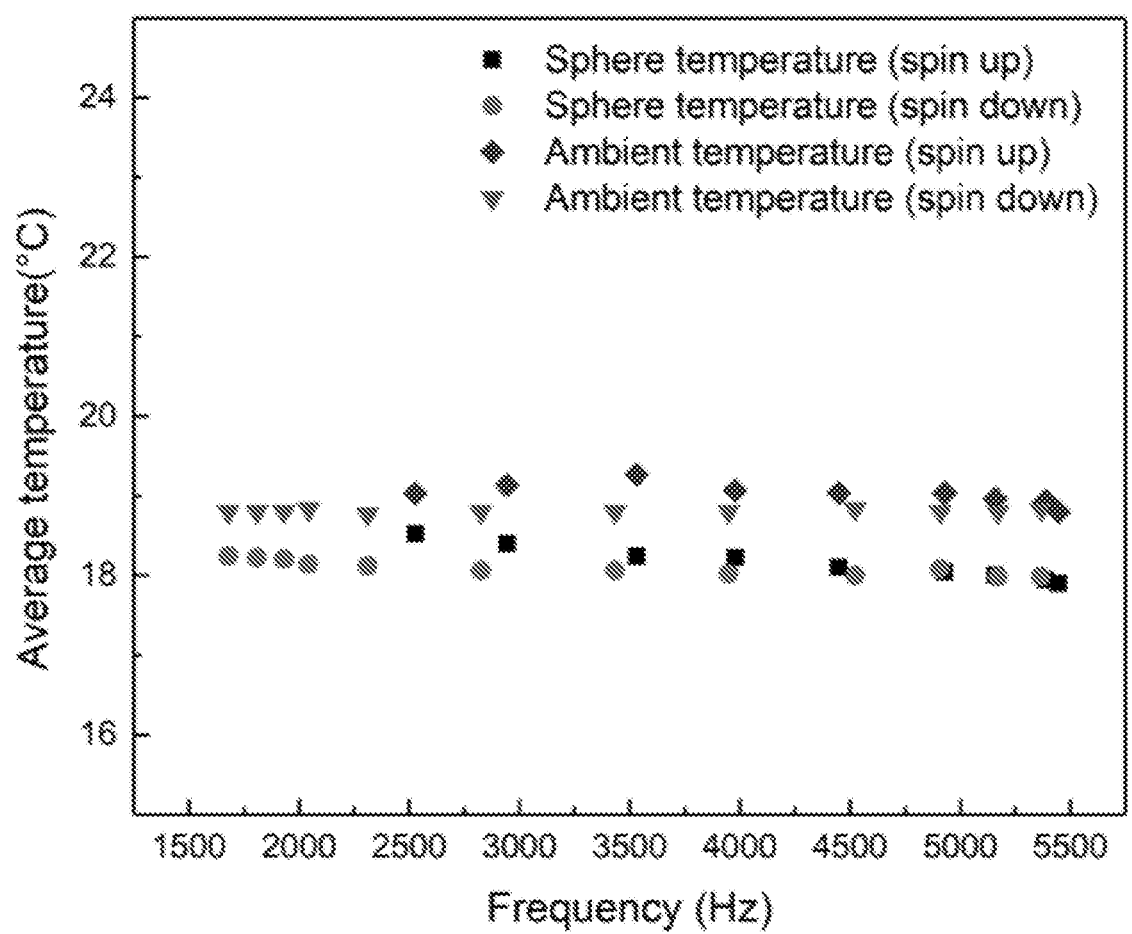
FIG. 12 is a plot showing the correlation between temperature and spinning frequency of spherical rotor.

The correlation between temperature and the spinning frequency was recorded as the spherical rotor was spun up to 5.5 kHz and back down to a stop using air (FIG. 12). The temperatures were recorded using an infrared (IR) thermometer (Fluke 62 MAX IR Thermometer) at about 6 in. away from the object to be measured. The temperature of the table with the spinning test station was measured as the ambient temperature to ensure that temperature fluctuations within the room did not affect the temperature of the spherical rotor. The fluctuation of the temperature was below 0.7° C., indicating little dependence of temperature on MAS frequencies. A slight temperature decrease at the rotor was observed when the spinning frequency went up. This cooling was attributed to the increased cooling capacity of air at higher flow rate. At frequencies <10 kHz, the heat transferred from kinetic energy friction of the air molecules at the rotor surface does not seem to be enough to induce heating.

CONCLUSION

MAS spheres have been demonstrated with practical advantages over their cylindrical counterparts. Implementation of spherical rotors is expected to lead to higher spinning frequencies through the optimization of turbine and stator geometry. With the relatively straightforward design of the current spherical rotors and supporting stators, the implementation of MAS spheres described here should scale well to micrometer-sized rotors. Access to small rotors can better enable MAS at frequencies >150 kHz (34), and spheres are currently being designed at 2 mm for MAS DNP.

The single aperture in stators used to spin spherical rotors could facilitate adoption of cryogenic MAS DNP into narrow-bore magnets. Currently, vacuum-jacketed transfer lines are required to provide separate bearing, drive, and variable temperature gases. MAS spheres, as demonstrated herein, only require a single gas stream, decreasing the space required within high-field superconducting magnet bores.

NMR sensitivity of samples packed within spherical rotors can be improved through modifications of the transmit-receive coil and stators. For instance, coil geometries such as saddle coils can yield better filling factors and are still amenable to simplified vertical sample exchange. Such inductors can also permit more efficient microwave coupling to the sample for MAS DNP experiments while maintaining sample exchange ability.

Finally, spherical rotors for magnetic resonance can also have widespread application in variable angle spinning (VAS), switched angle spinning (SAS) (38-40), and double angle rotation (DOR) (41, 42). For instance, introducing a second gas inlet into the stator can establish spinning off of the magic angle. Spherical rotors are expected to play a prominent role in the future development of MAS NMR.

REFERENCES

1. I. J. Lowe, Free induction decays of rotating solids. Phys. Rev. Lett. 2, 285-287 (1959).
2. E. R. Andrew, A. Bradbury, R. G. Eades, Nuclear magnetic resonance spectra from a crystal rotated at high speed. Nature 182, 1659 (1958).
3. M. D. Tuttle, G. Comellas, A. J. Nieuwkoop, D. J. Covell, D. A. Berthold, K. D. Kloepper, J. M. Courtney, J. K. Kim, A. M. Barclay, A. Kendall, W. Wan, G. Stubbs, C. D. Schwieters, V. M. Y. Lee, J. M. George, C. M. Rienstra, Solid-state NMR structure of a pathogenic fibril of full-length human α-synuclein. Nat. Struct. Mol. Biol. 23, 1-9 (2016).
4. M. Kaplan, S. Narasimhan, C. de Heus, D. Mance, S. van Doorn, K. Houben, Geerts, A. J. R. Heck, G. E. Folkers, L. C. Kapitein, S. Lemeer, P. M. P. van Bergen en Henegouwen, M. Baldus, EGFR dynamics change during a aled by NMR. Cell 167, 1241-1251.e11 (2016).
5. F. Castellani, B. van Rossum, A. Diehl, M. Schubert, K. Rehbein, H. Oschkinat, Structure of a protein determined by solid-state magic-angle-spinning NMR spectroscopy. Nature 420, 98-102 (2002).
6. S. G. Zech, A. J. Wand, A. E. McDermott, Protein structure determination by high-resolution solid-state NMR spectroscopy: Application to microcrystalline ubiquitin. J. Am. Chem. Soc. 127, 8618-8626 (2005).
7. B. G. Caulkins, R. P. Young, R. A. Kudla, C. Yang, T. J. Bittbauer, B. Bastin, E. Hilario, L. Fan, M. J. Marsella, M. F. Dunn, L. J. Mueller, NMR crystallography of a carbanionic intermediate in tryptophan synthase: Chemical structure, tautomerization, and reaction specificity. J. Am. Chem. Soc. 138, 15214-15226 (2016).
8. J. S. Retel, A. J. Nieuwkoop, M. Hiller, V. A. Higman, E. Barbet-Massin, J. Stanek, L. B. Andreas, W. T. Franks, B. J. van Rossum, K. R. Vinothkumar, L. Handel, G. G. de Palma, B. Bardiaux, G. Pintacuda, L. Emsley, W. Kühlbrandt, H. Oschkinat, Structure of outer membrane protein G in lipid bilayers. Nat. Commun. 8, 2073 (2017).
9. M. T. Eddy, L. Andreas, O. Teijido, Y. Su, L. Clark, S. Y. Noskov, G. Wagner, T. K. Rostovtseva, R. G. Griffin, Magic angle spinning nuclear magnetic resonance characterization of voltage-dependent anion channel gating in two-dimensional lipid crystalline bilayers. Biochemistry 54, 994-1005 (2015).
10. Q. Z. Ni, T. V. Can, E. Daviso, M. Belenky, R. G. Griffin, J. Herzfeld, Primary transfer step in the light-driven ion pump bacteriorhodopsin: An irreversible U-turn revealed by dynamic nuclear polarization-enhanced magic angle spinning NMR. J. Am. Chem. Soc. 140, 4085-4091 (2018).
11. A. McDermott, Structure and dynamics of membrane proteins by magic angle spinning solid-state NMR. Annu. Rev. Biophys. 38, 385-403 (2009).
12. H. Yang, D. Staveness, S. M. Ryckbosch, A. D. Axtman, B. A. Loy, A. B. Barnes, V. S. Pande, J. Schaefer, P. A. Wender, L. Cegelski, REDOR NMR reveals multiple conformers for a protein kinase C ligand in a membrane environment. ACS Cent. Sci. 4, 89-96 (2018).
13. L. A. Baker, T. Sinnige, P. Schellenberger, J. de Keyzer, C. A. Siebert, A. J. M. Driessen, M. Baldus, K. Grunewald, Combined 1H-detected solid-state NMR spectroscopy and electron cryotomography to study membrane proteins across resolutions in native environments. Structure 26, 161-170.e3 (2018).
14. M. Renault, S. Pawsey, M. P. Bos, E. J. Koers, D. Nand, R. Tommassen-van Boxtel, M. Rosay, J. Tommassen, W. E. Maas, M. Baldus, Solid-state NMR spectroscopy on cellular preparations enhanced by dynamic nuclear polarization. Angew. Chem. Int. Ed. Engl. 51, 2998-3001 (2012).
15. M. Kaplan, A. Cukkemane, G. C. P. van Zundert, S. Narasimhan, M. Daniels, D. Mance, G. Waksman, A. M. J. J. Bonvin, R. Fronzes, G. E. Folkers, M. Baldus, Probing a cell-embedded megadalton protein complex by DNP-supported solid-state NMR. Nat. Methods 12, 5-9 (2015).
16. A. B. Siemer, C. Ritter, M. Ernst, R. Riek, B. H. Meier, High-resolution solid-state NMR spectroscopy of the prion protein HET-s in its amyloid conformation. Angew. Chem. Int. Ed. Engl. 44, 2441-2444 (2005).
17. C. L. Hoop, H. K. Lin, K. Kar, G. Magyarfalvi, J. M. Lamley, J. C. Boatz, A. Mandal, J. R. Lewandowski, R. Wetzel, P. C. A. van der Wel, Huntingtin exon 1 fibrils feature an interdigitated β-hairpin-based polyglutamine core. Proc. Natl. Acad. Sci. U.S.A. 113, 1546-1551 (2016).
18. T. Theint, P. S. Nadaud, D. Aucoin, J. J. Helmus, S. P. Pondaven, K. Surewicz, W. K. Surewicz, C. P. Jaroniec, Species-dependent structural polymorphism of Y145Stop prion protein amyloid revealed by solid-state NMR spectroscopy. Nat. Commun. 8, 753 (2017).
19. A. T. Petkova, R. D. Leapman, Z. Guo, W. M. Yau, M. P. Mattson, R. Tycko, Self-propagating, molecular-level polymorphism in Alzheimer's L-amyloid fibrils. Science 307, 262-265 (2005).
20. O. A. McCrate, X. Zhou, C. Reichhardt, L. Cegelski, Sum of the parts: Composition and architecture of the bacterial extracellular matrix. J. Mol. Biol. 425, 4286-4294 (2013).
21. W. Thongsomboon, D. O. Serra, A. Possling, C. Hadjineophytou, R. Hengge, L. Cegelski, Phosphoethanolamine cellulose: A naturally produced chemically modified cellulose. Science 359, 334-338 (2018).
22. M. Bertmer, R. C. Nieuwendaal, A. B. Barnes, S. E. Hayes, Solid-state photodimerization kinetics of α-trans-cinnamic acid to α-truxillic acid studied via solid-state NMR. J. Phys. Chem. B 110, 6270-6273 (2006).
23. A. J. Rossini, A. Zagdoun, M. Lelli, J. Canivet, S. Aguado, O. Ouari, P. Tordo, M. Rosay, W. E. Maas, C. Coperet, D. Farrusseng, L. Emsley, A. Lesage, Dynamic nuclear polarization enhanced solid-state NMR spectroscopy of functionalized metal-organic frameworks. Angew. Chem. 124, 127-131 (2012).
24. Z. Wang, N. Opembe, T. Kobayashi, N. C. Nelson, I. I. Slowing, M. Pruski, Quantitative atomic-scale structure characterization of ordered mesoporous carbon materials by solid state NMR. Carbon 131, 102-110 (2018).
25 A. Lesage, M. Lelli, D. Gajan, M. A. Caporini, V. Vitzthum, P. Mieville, J. Alauzun, A. Roussey, C. Thieuleux, A. Mehdi, G. Bodenhausen, C. Coperet, L. Emsley, Surface enhanced NMR spectroscopy by dynamic nuclear polarization. J. Am. Chem. Soc. 132, 15459-15461 (2010).
26. L. B. Andreas, K. Jaudzems, J. Stanek, D. Lalli, A. Bertarello, T. Le Marchand, D. Cala-De Paepe, S. Kotelovica, I. Akopjana, B. Knott, S. Wegner, F. Engelke, A. Lesage, L. Emsley, K. Tars, T. Herrmann, G. Pintacuda, Structure of fully protonated proteins by proton-detected magic-angle spinning NMR. Proc. Natl. Acad. Sci. U.S.A. 113, 9187-9192 (2016).
27. D. H. Zhou, D. T. Graesser, W. T. Franks, C. M. Rienstra, Sensitivity and resolution in proton solid-state NMR at intermediate deuteration levels: Quantitative linewidth characterization and applications to correlation spectroscopy. J. Magn. Reson. 178, 297-307 (2006).
28. N. P. Wickramasinghe, Y. Ishii, Sensitivity enhancement, assignment, and distance measurement in 13 C solid-state NMR spectroscopy for paramagnetic systems under fast magic angle spinning. J. Magn. Reson. 181, 233-243 (2006).
29. V. Chevelkov, B. J. van Rossum, F. Castellani, K. Rehbein, A. Diehl, M. Hohwy, S. Steuernagel, F. Engelke, H. Oschkinat, B. Reif, 1H detection in MAS solid-state NMR spectroscopy of biomacromolecules employing pulsed field gradients for residual solvent suppression. J. Am. Chem. Soc. 125, 7788-7789 (2003).
30. A. B. Barnes, M. L. Mak-Jurkauskas, Y. Matsuki, V. S. Bajaj, P. C. A. van der Wel, R. DeRocher, J. Bryant, J. R. Sirigiri, R. J. Temkin, J. Lugtenburg, J. Herzfeld, R. G. Griffin, Cryogenic sample exchange NMR probe for magic angle spinning dynamic nuclear polarization. J. Magn. Reson. 198, 261-270 (2009).
31. E. P. Saliba, E. L. Sesti, F. J. Scott, B. J. Albert, E. J. Choi, N. Alaniva, C. Gao, A. B. Barnes, Electron decoupling with dynamic nuclear polarization in rotating solids. J. Am. Chem. Soc. 139, 6310-6313 (2017).
32. D. E. M. Hoff, B. J. Albert, E. P. Saliba, F. J. Scott, E. J. Choi, M. Mardini, A. B. Barnes, Frequency swept microwaves for hyperfine decoupling and time domain dynamic nuclear polarization. Solid State Nucl. Magn. Reson. 72, 79-89 (2015).
33. T. V. Can, R. T. Weber, J. J. Walish, T. M. Swager, R. G. Griffin, Frequency-swept integrated solid effect. Angew. Chem. Int. Ed. 56, 6744 (2017).
34. K. Xue, R. Sarkar, C. Motz, S. Asami, V. Decker, S. Wegner, Z. Tosner, B. Reif, Magic angle spinning frequencies beyond 300 kHz are necessary to yield 35. M. Schuck, D. Steinert, T. Nussbaumer, J. W. Kolar, Ultrafast rotation of magnetically levitated macroscopic steel spheres. Sci. Adv. 4, e1701519 (2018).
36. J. S. Frye, G. E. Maciel, Setting the magic angle using a quadrupolar nuclide. J. Magn. Reson. 48, 125-131 (1982).
37. E. Mihaliuk, T. Gullion, Using heat to control the sample spinning speed in MAS NMR. J. Magn. Reson. 212, 249-253 (2011).
38. T. Terao, T. Fujii, T. Onodera, A. Saika, Switching-angle sample-spinning NMR spectroscopy for obtaining powder-pattern-resolved 2D spectra: Measurements of 13 C chemical-shift anisotropies in powdered 3,4-dimethoxybenzaldehyde. Chem. Phys. Lett. 107, 145-148 (1984).
39. A. C. Kolbert, P. J. Grandinetti, M. Baldwin, S. B. Prusiner, A. Pines, Measurement of internuclear distances by switched angle spinning. J. Phys. Chem. 98, 7936-7938 (1994).
40. I. M. Litvak, C. A. Espinosa, R. A. Shapiro, A. N. Oldham, V. V. Duong, R. W. Martin, Pneumatic switched angle spinning NMR probe with capacitively coupled double saddle coil. J. Magn. Reson. 206, 183-189 (2010).
41. B. F. Chmelka, K. T. Mueller, A. Pines, J. Stebbins, Y. Wu, J. W. Zwanziger, Oxygen-17 NMR in solids by dynamic-angle spinning and double rotation. Nature 339, 42-43 (1989).
42. A. Samoson, E. Lippmaa, A. Pines, High resolution solid-state N.M.R. Mol. Phys. 65, 1013-1018 (1988).

What is claimed is:

1. A spherical rotor comprising:
a spherical rotor surface;
a spherical rotor axis;
a plurality of equatorially spaced notches on the spherical rotor surface, wherein the plurality of equatorially spaced notches are equatorially spaced around the spherical rotor axis such that the plurality of equatorially spaced notches are positioned such that each notch spans both sides of an equator of the spherical rotor surface; and
a sample chamber comprising a sample chamber axis, wherein the sample chamber axis is parallel to the spherical rotor axis.

2. The spherical rotor of claim 1, wherein the spherical rotor is between about 1 micron and 20 microns in size.

3. The spherical rotor of claim 1, wherein the spherical rotor comprises a sample.

4. The spherical rotor of claim 1, wherein the notches provide torque to the spherical rotor when a fluid supply is applied to the spherical rotor.

5. The spherical rotor of claim 1, wherein the spherical rotor comprises a composition having an intrinsic dipole moment.

6. The spherical rotor of claim 1, wherein the spherical rotor is between about 20 microns or greater in size.

7. The spherical rotor of claim 1, wherein the spherical rotor is between about 20 microns and 10 mm in size.

8. A system for use in nuclear magnetic resonance (NMR) spectroscopy comprising:
a spherical rotor, wherein the spherical rotor comprises a spherical rotor surface, a spherical rotor axis and a plurality of equatorially spaced notches on the spherical rotor surface, wherein the plurality of equatorially spaced notches are equatorially spaced around the spherical rotor axis such that the plurality of equatorially spaced notches are positioned such that each notch spans both sides of an equator of the spherical rotor surface;
a sample chamber comprising a sample chamber axis, wherein the sample chamber axis is parallel to the spherical rotor axis; and
a stator suitable for incorporation and spinning of the spherical rotor, wherein the stator optionally comprises at least one gas inlet and at least one exhaust gas outlet.

9. The system of claim 8, wherein
the spherical rotor comprises one or more sample chamber caps;
the stator comprises one or more fluid lines;
the stator comprises one or more exhaust gas outlets; or
the stator comprises blind holes for incorporation of a fiber optic cable.

10. The system of claim 8 wherein, upon application of a fluid, a time-dependent electro, magnetic, or electromagnetic field, or light, the spherical rotor is a turbine.

11. The system of claim 8 wherein, the spherical rotor or stator is a 3D printed rotor or stator.

12. The system of claim 8, further comprising an RF coil, wherein the system is suitable for incorporation into a NMR probe.

13. The system of claim 12, wherein the NMR probe is a solid state NMR probe, a liquid state NMR probe, or a cryogenic MAS-DNP NMR probe.

14. The system of claim 8, wherein the stator comprises a gas inlet, wherein the gas inlet provides a fluid supply to the spherical rotor.

15. The system of claim 14, wherein the fluid supply provides bearing and turbine.

16. The system of claim 8, further comprising a fluid line for cooling of a fluid and the spherical rotor to a temperature of less than about 4.2 K resulting in a superfluid zero viscosity phase of helium.

17. The system of claim 8, further comprising a sample exchange system using the spherical rotor, wherein the sample exchange system comprises a sample exchange tube and a vacuum line or air line to eject the spherical rotor.

18. The system of claim 8, wherein the spherical rotor comprises a sample or holds the sample.

19. The system of claim 8, wherein the spherical rotor rotates at a frequency from about 0 kHz to about 130 kHz.

20. The system of claim 8, wherein the spherical rotor is 3D printed or comprises zirconia.

21. The system of claim 8 further comprising a transmit-receive RF coil, wherein the transmit-receive RF coil is a four-turn split solenoid wrapped around the stator or the spherical rotor.

22. The system of claim 8, comprising a cooling bath capable of reaching cryogenic temperatures between about 1.2 K and about 200 K and optionally a vacuum to achieve cryogenic temperatures below 2.23 K.

23. The system of claim 8, further comprising a fluid line for cooling of a fluid and the spherical rotor to a temperature of less than about 2.23 K, resulting in a superfluid zero viscosity phase of helium.

24. A method of obtaining a nuclear magnetic resonance (NMR) signal comprising:
providing a sample;
inserting the sample into a spherical rotor comprising equatorially spaced notches such that the equatorially spaced notches span both sides of an equator of the spherical rotor;

placing the spherical rotor onto or into a stator, wherein the stator is inside an NMR probe;

spinning the spherical rotor; and obtaining an NMR signal from the sample.

25. The method of claim 24, further comprising spinning the spherical rotor at about 54.7356° with respect to a magnetic field.

26. The method of claim 24, further comprising placing the spherical rotor into a magnetic field.

27. The method of claim 24, further comprising switched angle magic angle spinning comprising a spinning axis, wherein the spinning axis is changed during an NMR experiment.

28. The method of claim 24, further comprising:

spinning the spherical rotor comprising the sample;

removing the spherical rotor from a magnetic field;

returning the spherical rotor to the magnetic field; and detecting a nuclear magnetic resonance signal from the sample.

29. The method of claim 24, further comprising fast mechanical exchange of the spherical rotor into another magnet for signal detection or for storage of enhanced spin magnetization.

30. The method of claim 24, further comprising placing the spherical rotor into a probe for NMR detection.

31. The method of claim 24, wherein a gas introduced under the spherical rotor at a 35.3° angle with respect to a magnetic field, $B_0$, suspends the spherical rotor and aligns its spinning axis to 54.7° angle with respect to the magnetic field, $B_0$.

32. The method of claim 24, wherein spinning the spherical rotor comprises polarizing the spherical rotor, allowing for spinning propulsion.

33. The method of claim 24, comprising phase locking, resulting in enhanced spinning stability compared to a non-phase locked system.

34. The method of claim 24, comprising creating a static electric dipole (separating positive and negative charges) by applying a static electric field to a sample comprising mobile ions; and freezing the sample, thus trapping the separated positive and negative charges.

* * * * *